US005715320A

United States Patent [19]

Allie et al.

[11] Patent Number: 5,715,320

[45] **Date of Patent: *Feb. 3, 1998**

[54] ACTIVE ADAPTIVE SELECTIVE CONTROL SYSTEM

[75] Inventors: Mark C. Allie, Oregon; Larry J. Eriksson; Charles W. Brokish, both of Madison, all of Wis.

[73] Assignee: Digisonix, Inc., Middleton, Wis.

[*] Notice: The term of this patent shall not extend beyond the expiration date of Pat. Nos. 5,586,190 and 5,586,189.

[21] Appl. No.: 517,464

[22] Filed: Aug. 21, 1995

[51] Int. Cl.$^6$ .......... H03B 29/00

[52] U.S. Cl. .......... 381/71.12; 381/71.11

[58] Field of Search .......... 381/71, 94, 71.1, 381/71.8, 71.11, 71.12, 94.1, 94.2, 94.9; 364/724.19; 333/166

[56] References Cited

U.S. PATENT DOCUMENTS

| | | | |
|---|---|---|---|
| 4,677,676 | 6/1987 | Eriksson | 381/71 |
| 4,677,677 | 6/1987 | Eriksson . | |
| 4,689,821 | 8/1987 | Salikuddin et al. | 381/71 |
| 4,736,431 | 4/1988 | Allie et al. . | |
| 4,791,390 | 12/1988 | Harris et al. | 364/724.19 |
| 4,837,834 | 6/1989 | Allie . | |
| 4,987,598 | 1/1991 | Eriksson . | |
| 5,033,082 | 7/1991 | Eriksson et al. . | |
| 5,117,401 | 5/1992 | Feintuch | 381/71 |
| 5,146,505 | 9/1992 | Pfaff et al. . | |
| 5,172,416 | 12/1992 | Allie et al. . | |
| 5,206,911 | 4/1993 | Eriksson et al. . | |
| 5,216,692 | 6/1993 | Ling . | |
| 5,216,721 | 6/1993 | Melton . | |
| 5,216,722 | 6/1993 | Popovich . | |
| 5,278,780 | 1/1994 | Eguchi | 381/71 |
| 5,278,913 | 1/1994 | Delfosse et al. . | |
| 5,337,366 | 8/1994 | Eguchi et al. . | |
| 5,386,472 | 1/1995 | Pfaff et al. . | |
| 5,386,477 | 1/1995 | Popovich et al. . | |
| 5,390,255 | 2/1995 | Popovich . | |
| 5,396,561 | 3/1995 | Popovich . | |

OTHER PUBLICATIONS

"Adaptive Filter Theory", Haykin, Prentice-Hall, Englewood Cliffs, New Jersey, 1986, pp. 216–219.

"Adaptive Filter Theory", Second Edition, Haykin, Prentice-Hall, Englewood Cliffs, New Jersey, 1991, pp. 688–689.

"Active Adaptive Sound Control In A Duct: A Computer Simulation", J.C. Burgess, Journal of Acoustic Society of America, 70(3), Sep. 1981, pp. 715–726.

"Number Theory In Science And Communications", M.R. Schroeder, Berlin, Springer–Berlag, 1984, pp. 252–261.

*Adaptive Signal Processing*, Widrow and Stearns, Prentice–Hall, Inc., Engelwood Cliffs, NJ, 1985, pp. 376–378.

"Adaptive Fuzzy Systems", E. Cox, IEE Spectrum Feb. 1993, pp.27–31.

*Primary Examiner*—Curtis Kuntz
*Assistant Examiner*—Vivian Chang
*Attorney, Agent, or Firm*—Andrus, Sceales, Starke & Sawall

[57] ABSTRACT

An active adaptive control system introduces a control signal from an output transducer (14) to combine with the system input signal (6) and yield a system output signal (8). An error transducer (16) senses the system output signal and provides an error signal (44). An adaptive filter model (40) has a model input from a reference signal (42) correlated to the system input signal, and an output outputting a correction signal (46) to the output transducer to introduce the control signal. Performance of the model is selectively controlled to control the signal sent to the output transducer. Various monitoring and control methods are provided, including spectral leak signal monitoring and control, correction signal monitoring and control, frequency responsive spectral transfer function processing of the leak signal and/or the correction signal, reference signal processing, and fuzzy logic control.

42 Claims, 14 Drawing Sheets

FIG. 9
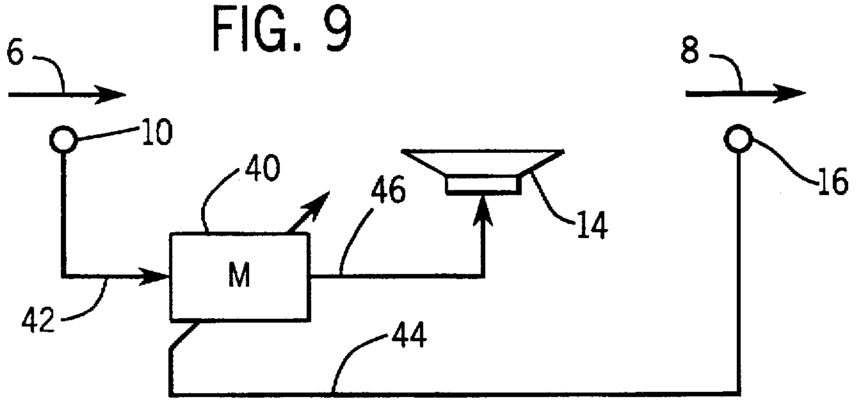
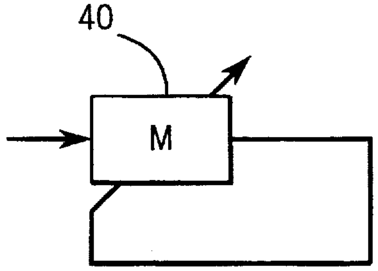
FIG. 10
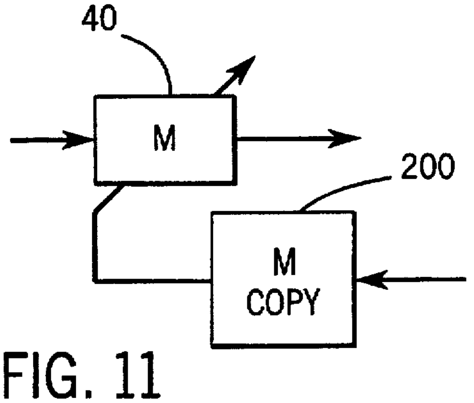
FIG. 11
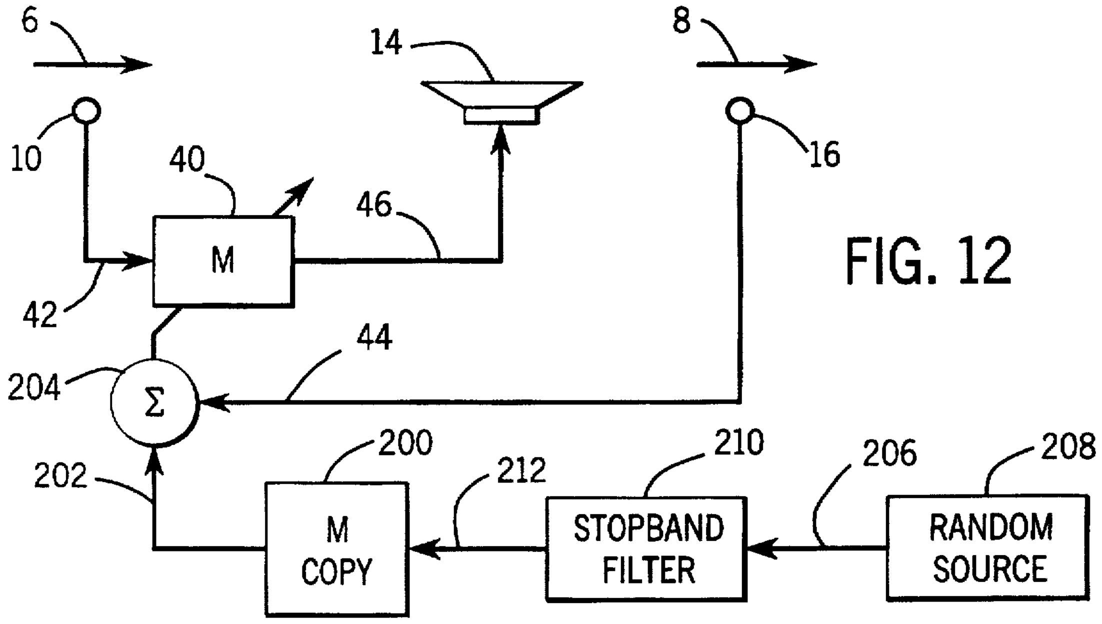
FIG. 12

ACTIVE ADAPTIVE SELECTIVE CONTROL SYSTEM

BACKGROUND AND SUMMARY

This invention relates to active adaptive control systems, and more particularly to improvements for selectively controlling performance of the active adaptive model.

The invention arose during continuing development efforts relating to the subject matter of U.S. Pat. Nos. 4,837,834, 5,172,416, 5,278,913, 5,386,477, 5,390,255, 5,396,561, and co-pending U.S. application Ser. No. 08/166,698, filed Dec. 14, 1993, Ser. No. 08/247,561, filed May 23, 1994, Ser. No. 08/264,510, filed Jun. 23, 1994, Ser. No. 08/340,613, filed Nov. 16, 1994, Ser. No. 08/369,925, filed Jan. 6, 1995, incorporated herein by reference.

Active acoustic attenuation involves injecting a canceling acoustic wave to destructively interfere with and cancel an input acoustic wave. In an active acoustic attenuation system, the output acoustic wave is sensed with an error transducer, such as a microphone or an accelerometer, which supplies an error signal to an adaptive filter control model which in turn supplies a correction signal to a canceling output transducer or actuator, such as a loudspeaker or a shaker, which injects an acoustic wave to destructively interfere with the input acoustic wave and cancel or reduce same such that the output acoustic wave at the error transducer is zero or some other desired value.

An active adaptive control system minimizes an error signal by introducing a control signal from an output transducer to combine with the system input signal and yield a system output signal. The system output signal is sensed with an error transducer providing the error signal. An adaptive filter model has a model input from a reference signal correlated with the system input signal, an error input from the error signal, and outputs a correction signal to the output transducer to introduce a control signal matching the system input signal, to minimize the error signal. The filter coefficients are updated according to a weight update signal which is the product of the reference signal and the error signal.

The present invention is applicable to active adaptive control systems, including active acoustic attenuation systems. In one embodiment, the invention maximizes model performance by concentrating model adaptation in frequency ranges of interest, and protects the output transducer against overdriving of same. Performance of the model is spectrally controlled to maximize the correction signal sent to the output transducer such that at frequencies where maximum power from the output transducer reaches the error transducer, the correction signal supplied to the output transducer is maximized, and at frequencies where minimum power from the output transducer reaches the error transducer, the correction signal supplied to the output transducer is minimized. This maximizes model performance by concentrating model adaptation on the portion of the input signal which the model can control or cancel or where it is desired to do so, and constrains model adaptation as to those portions of the input signal which it cannot cancel or control or where it is not desired to do so. The latter is desired for stability of the model algorithm where active control solutions sometimes require more actuator power than is available or desirable. Actuators, amplifiers, etc. have limitations that adversely affect control algorithms. Pushed beyond capacity, the control output or power available from the secondary source or output transducer may exhibit saturation, clipping, or otherwise nonlinear behavior. Excessive control effort can result in damaged actuators, excessive power consumption, and instability in the control algorithm.

It is known in the prior art to provide weight update signal leakage to counteract the adaptive process. This is done by implementing an exponential decay of the filter coefficients, intentionally defeating control effort, Widrow and Stearns, *Adaptive Signal Processing*, Prentice-Hall, Inc., Engelwood Cliffs, N.J., 1985, pages 376–378. The exponential decay is typically selected to be slow such that the adaptive process toward a control solution dominates. A deficiency of this method is that it unilaterally, across all power levels and frequencies, degrades performance. Such leakage is useful for limiting control effort and enhancing numerical stability, but performance suffers because of the lack of consideration for regions where the control effort is in an acceptable range.

In other embodiments of the invention, model adaptation is selectively controlled to provide desired performance. Model performance is controlled by fuzzy logic to provide self-designing control architecture using fuzzy rules and/or to control a filter transfer function and/or to control filter weights used in an update process for feedforward and/or feedback, including FIR (finite impulse response) and IIR (infinite impulse response) applications and/or to control magnitude and/or rate of change of a leak signal degrading performance of the model.

BRIEF DESCRIPTION OF THE DRAWINGS

FIG. 9 is a schematic illustration of an active adaptive control system.

FIG. 10 is a schematic illustration of an adaptive filter model, and illustrates a principle employed by a system in accordance with copending U.S. application Ser. No. 08/166,698, filed Dec. 14, 1993.

FIG. 11 is like FIG. 10 and shows another manner of implementing the principle thereof.

FIG. 12 is a schematic illustration of an active adaptive control system in accordance with the system of the '698 application.

DETAILED DESCRIPTION

Figure 1:
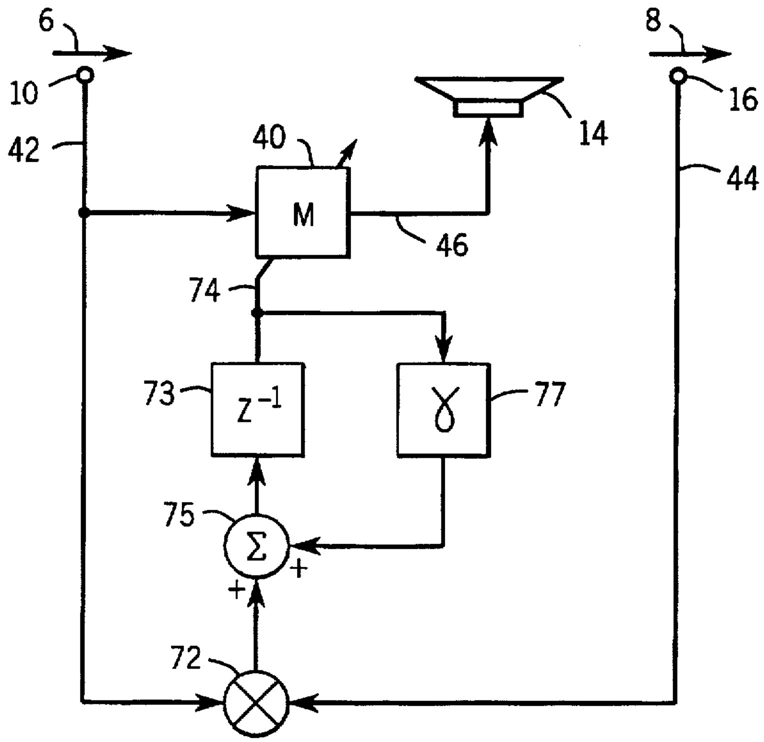
FIG. 1 PRIOR ART
FIG. 1 is a schematic illustration of an active adaptive control system known in the prior art.

FIG. 1 shows an active adaptive control system similar to that shown in U.S. Pat. No. 4,677,676, incorporated herein by reference, and uses like reference numerals therefrom where appropriate to facilitate understanding. The system introduces a control signal from a secondary source or output transducer 14, such as a loudspeaker, shaker, or other actuator or controller, to combine with the system input signal 6 and yield a system output signal 8. An input transducer 10, such as a microphone, accelerometer, or other sensor, senses the system input signal and provides a reference signal 42. An error transducer 16, such as a microphone, accelerometer, or other sensor, senses the system output signal and provides an error signal 44. Adaptive filter model 40 adaptively models the system and has a model input from reference signal 42 correlated to system input signal 6, and an output outputting a correction signal 46 to output transducer 14 to introduce the control signal according to a weight update signal 74. Reference signal 42 and error signal 44 are combined at multiplier 72 to provide the weight update signal through delay element 73. In a known alternative, the reference signal 42 may be provided by one or more error signals, in the case of a periodic system input signal. "Active Adaptive Sound Control In A Duct: A Computer Simulation", J. C. Burgess, Journal of Acoustic Society of America, 70(3), September 1981, pages 715–726, U.S. Pat. Nos. 5,206,911, 5,216,722, incorporated herein by reference.

In updating the filter coefficients, and as is standard, one or more previous weights are added to the current product of reference signal 42 and error signal 44 at summer 75. As noted above, it is known in the prior art to provide exponential decay of all of the filter coefficients in the system. Leakage factor γ at 77 multiplies one or more previous weights, after passage through one or more delay elements 73, by an exponential decay factor less than one before adding same at summer 75 to the current product of reference signal 42 and error signal 44, *Adaptive Signal Processing*, Widrow and Stearns, Prentice-Hall, Inc., Engelwood Cliffs, N.J., 1985, pages 376–378, including equations 13.27 and 13.31. As noted above, a deficiency of this method is that it reduces control effort and degrades performance across all power levels, regardless of whether such reduced effort is desired.

In the '510 application, selective leakage of the weight update signal is provided in response to a given condition of a given parameter, to control performance of the model on an as needed basis. In the preferred embodiment, leakage is varied as a function of correction signal 46. A variable leakage factor γ is provided at 79 in FIG. 2, replacing fixed γ 77 of FIG. 1. Leakage factor γ at 79 is varied from a maximum value of 1.0 affording maximum control effort, to a minimum value such as zero providing minimum control effort.

Figure 3:
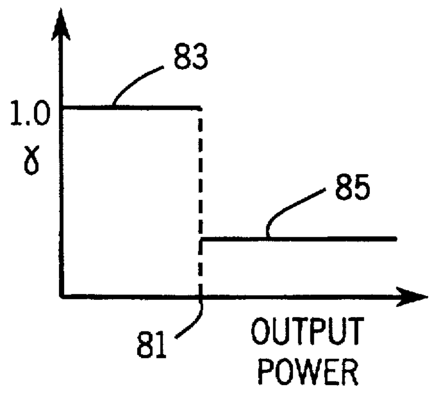
FIG. 3 is a graph showing performance of the system of FIG. 2.
Figure 4:
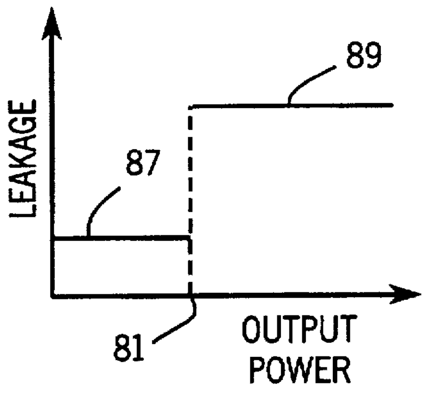
FIG. 4 is a graph further showing performance of the system of FIG. 2.

Leakage is varied as a function of the output power of correction signal 46 supplied from the output of model 40 to output transducer 14. In the embodiment in FIG. 3, the leakage is varied as a discontinuous step function of the output power of the correction signal. When the output power exceeds a given threshold at 81, γ is abruptly, nonlinearly changed as a step function from a first level 83 to a second level 85. The reduction at 85 reduces the weight update signal summed at summer 75 with the product of the reference signal 42 and error signal 44 from multiplier 72, and hence reduces the weight update signal supplied to model 40. The noted reduction of γ at threshold 81 increases leakage of the weight update signal, FIG. 4, from level 87 to level 89.

Figure 5:
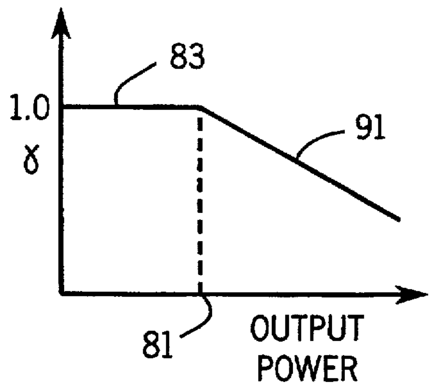
FIG. 5 is a graph showing an alternate performance of the system of FIG. 2.
Figure 6:
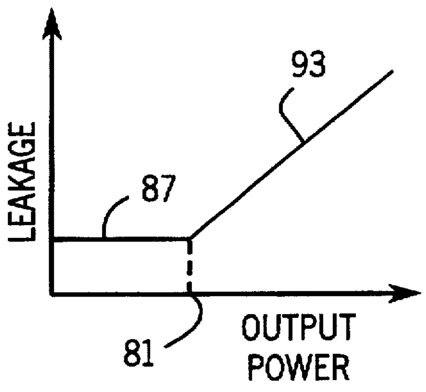
FIG. 6 is a graph further showing alternate performance of the system of FIG. 2.

In another embodiment as shown in FIG. 5, leakage is varied as a continuous function of the output power of the correction signal. In FIG. 5, γ is maintained at level 83 until output power reaches threshold 81, and then is linearly decreased as shown at 91 as a continuous linearly changing value as a function of increasing output power above threshold 81. As shown in FIG. 6, leakage is maintained at level 87 until output power reaches threshold 81, and then is linearly increased at 93 as a continuous linearly changing value as a function of increasing output power above threshold 81.

Other variations of leakage are possible for providing selective leakage of the weight update signal to degrade performance of the model. The leakage is adjustably varied to vary performance of the model by multiplying a previous weight update value by variable γ 79 and adding the result at summer 75 to the product of reference signal 42 and error signal 44 from multiplier 72. γ 79 is varied as a function of correction signal 46, preferably the output power of such correction signal.

Figure 2:
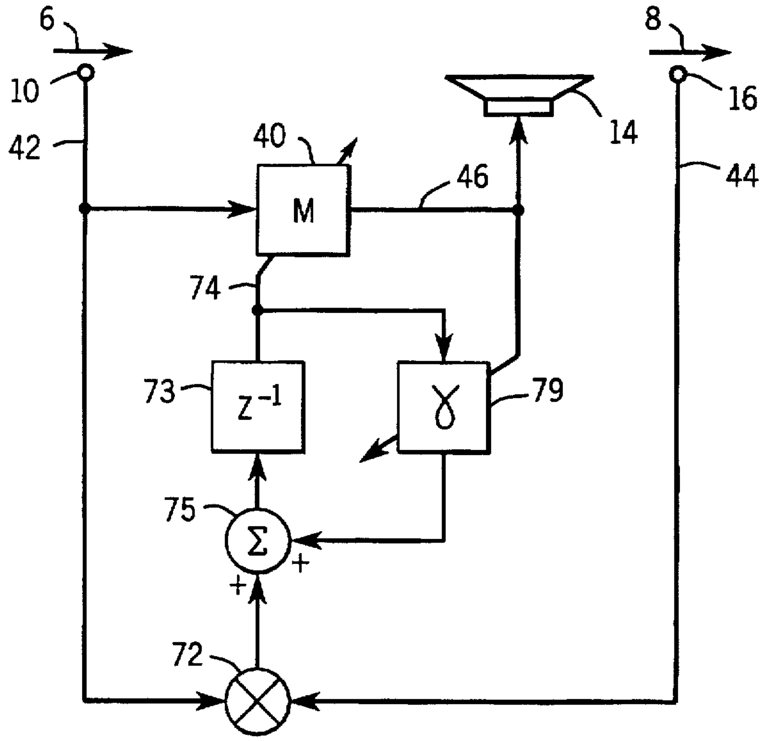
FIG. 2 is a schematic illustration of an active adaptive control system in accordance with co-pending U.S. application Ser. No. 08/264,510, filed Jun. 23, 1994.
Figure 7:
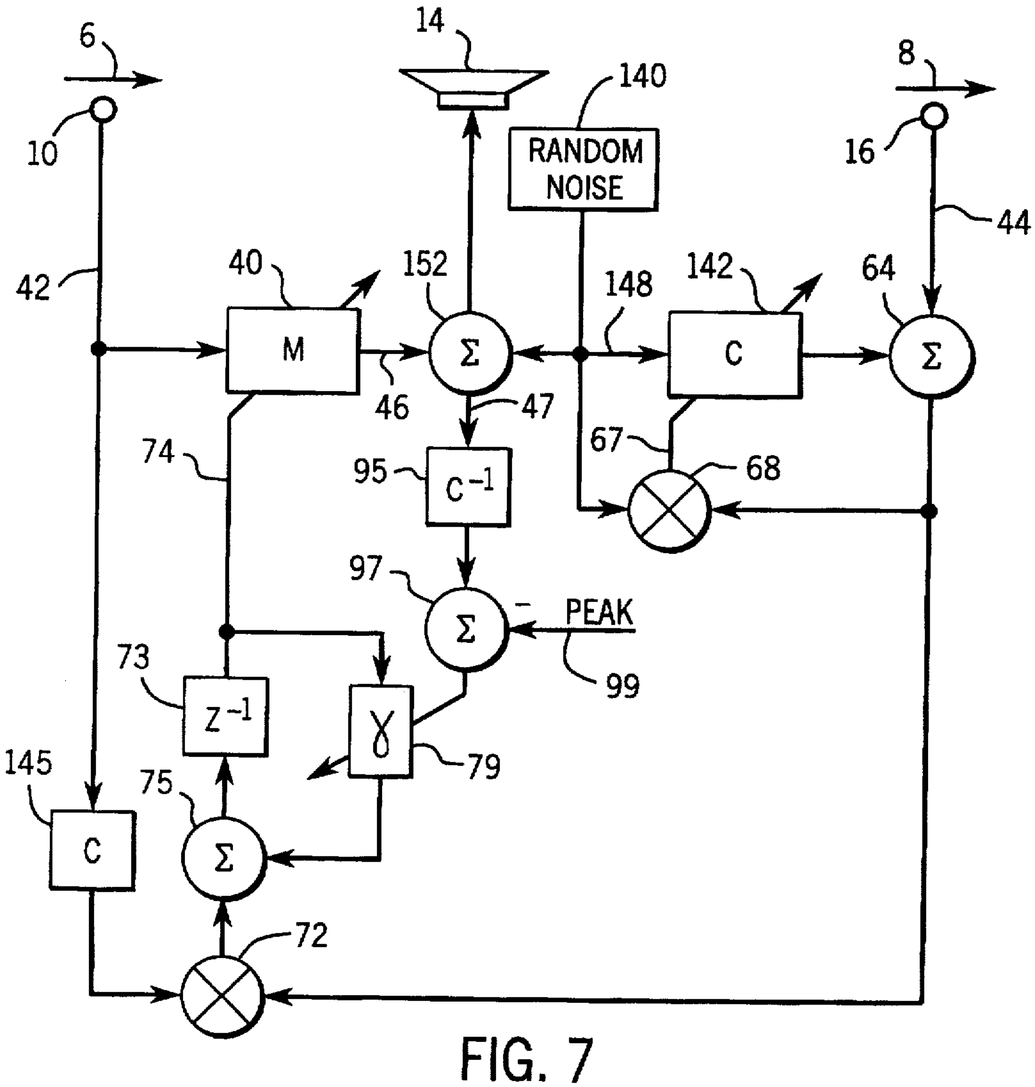
FIG. 7 is a schematic illustration of an active adaptive control system in accordance with the present invention.
Figure 19:
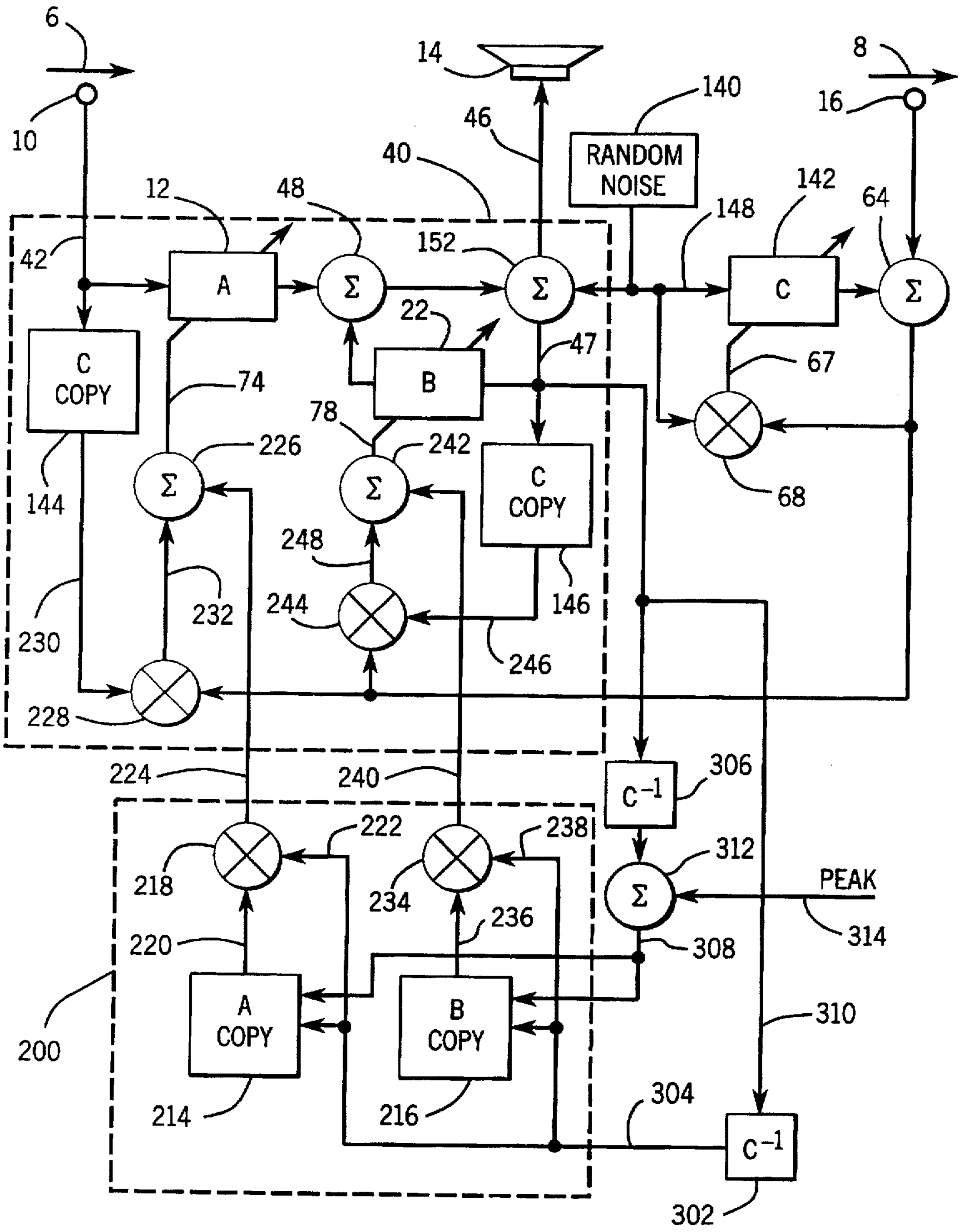
FIG. 19 shows a further embodiment of the system of FIG. 18.
Figure 20:
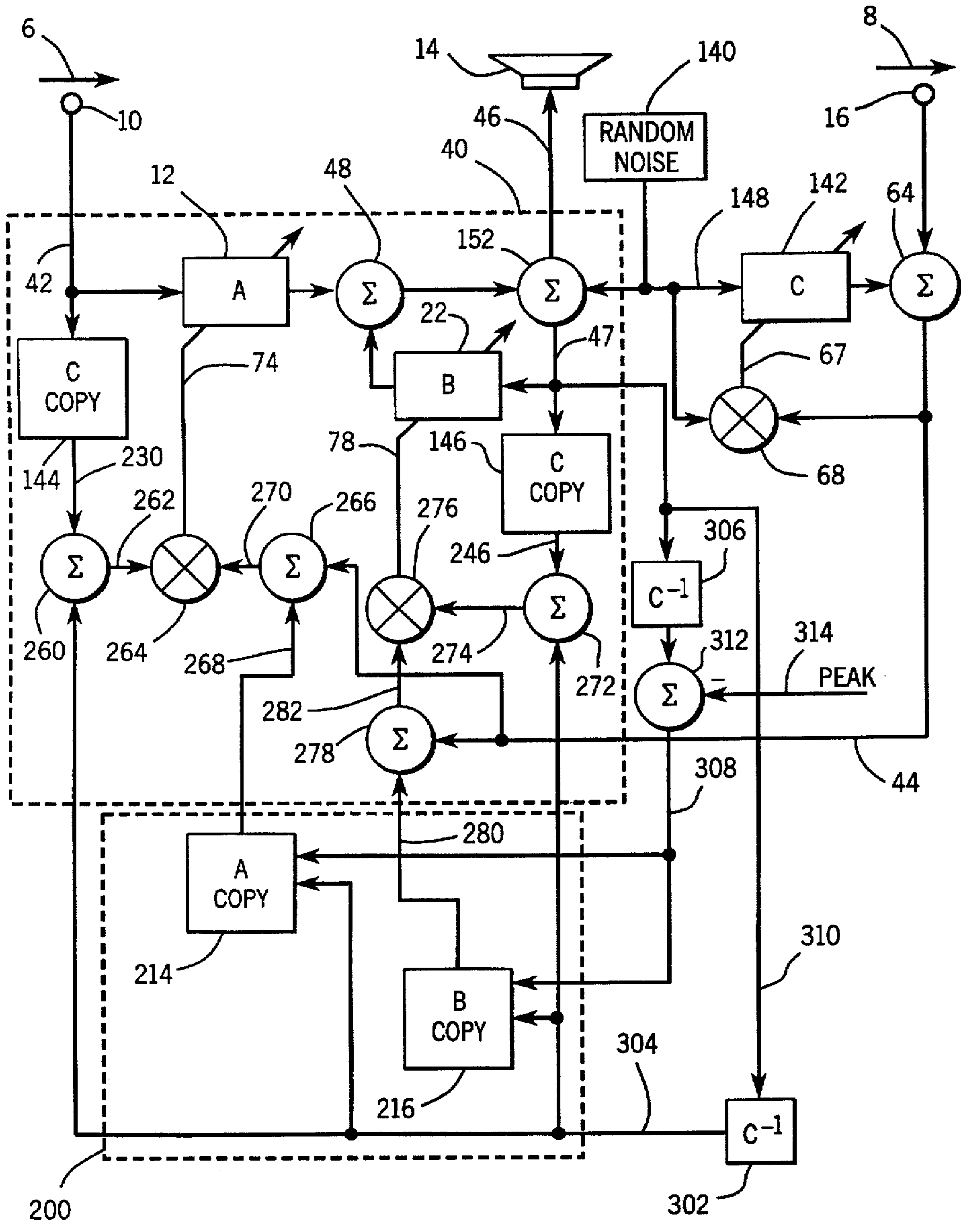
FIG. 20 shows a further embodiment of the system of FIG. 18.

FIG. 7 illustrates the present invention and uses like reference numerals from FIG. 2 and from FIGS. 19 and 20 of the incorporated '676 patent. The transfer function from output transducer 14 to error transducer 16 is modeled with an adaptive filter model C at 142, as in the incorporated '676 patent. Auxiliary random signal source 140 introduces a random signal into the output of model 40 at summer 152 and into the C model at 148. The auxiliary random signal from source 140 is random and uncorrelated with the system input signal 6 and in preferred form is provided by a Galois sequence, M. R. Schroeder, "Number Theory In Science And Communications", Berlin, Springer-Berlag, 1984, pages 252–261, though other random uncorrelated signal sources may be used. The Galois sequence is a pseudo random sequence that repeats after $2^M-1$ points, where M is the number of stages in a shift register. The Galois sequence is preferred because it is easy to calculate and can easily have a period much longer than the response time of the system. The input 148 to C model 142 is multiplied with the error signal from error transducer 16 at multiplier 68, and the resultant product provided as weight update signal 67. Model 142 models the transfer function from output transducer 14 to error transducer 16, including the transfer function of each. Alternatively, the transfer function from output transducer 14 to error transducer 16 may be modeled without a random signal source, as in U.S. Pat. No. 4,987,598, incorporated herein by reference. Auxiliary source 140 introduces an auxiliary random signal such that error transducer 16 also senses the auxiliary signal from the auxiliary source. The auxiliary signal may be introduced into the recursive loop of the A and B filters as in FIG. 19 of the incorporated '676 patent at summer 152, or alternatively the auxiliary signal may be introduced into the model after the recursive loop, i.e. introducing the auxiliary signal only to line 46, and not to line 47. A copy of model 142 is provided at 145 to compensate the noted transfer function, as in the incorporated '676 patent.

As in the '510 application, the present system and method involves introducing a control signal from output transducer 14 to combine with system input signal 6 and yield system output signal 8, sensing the system output signal with error transducer 16 and providing an error signal 44, providing adaptive filter model 40 having a model input from reference signal 42 correlated to system input signal 6, and an output outputting a correction signal 46 to output transducer 14 to introduce the control signal according to weight update signal 74. In the present invention, performance of model 40 is spectrally controlled to maximize the signal sent to output transducer 14 at frequencies of interest or where it can be maximally effective, and minimize the signal sent to output transducer 14 at frequencies of noninterest or where it is only minimally effective or is ineffective. A spectral leak signal is provided which degrades performance of the model. The leak signal is controlled according to frequency. In FIG. 7, the correction signal from the output of model 40 is monitored, and the leak signal is controlled in response thereto. The correction signal is filtered by filter 95 to provide the leak signal. The correction signal from the output of model 40 is spectrally processed by supplying the correction signal through the frequency responsive spectral transfer function provided by filter 95 to provide the leak signal to the error input of model 40. In FIG. 7, the correction signal is spectrally processed such that at frequencies where maximum power from output transducer 14 reaches error transducer 16, the correction signal is maximized, and at frequencies where minimum power from output transducer 14 reaches error transducer 16, the correction signal is minimized.

The transfer function between output transducer 14 and error transducer 16 is modeled with C model 142. Correction signal 46 is spectrally processed by a function of model 142. In FIG. 7, such function is the inverse of C model 142 as provided at inverse C model, $C^{-1}$, at 95. The output of inverse C model 95 is supplied to an optional peak detector as provided by summer 97 comparing the output of inverse C model 95 with a desired peak value 99. When the output of model 95 rises above level 99, the positive output of summer 97 controls variable leakage factor $\gamma$ at 79, as above. The inverse C model includes the inverse of the transfer function of output transducer 14, inverse S $S^{-1}$, and/or the inverse of the transfer function of the error path, inverse E, $E^{-1}$, between output transducer 14 and error transducer 16.

In addition to or in place of peak detector 97, control logic may be used to respond to the output of inverse C model 95 and control leakage factor $\gamma$ at 79 according to designated conditions or rules to generate or compute a leak value or control the leaking process, to be further described hereinafter. In other embodiments, filter 95 is a displacement function of output transducer 14 such as a loudspeaker, to protect the latter against overdriving. In other embodiments, an RMS (root mean square) to DC (direct current) conversion function is provided between filter 95 and peak detector 97 for average level detection to control convergence rate of the leak process. The transfer function of filter 95 may be linear or nonlinear.

Figure 8:
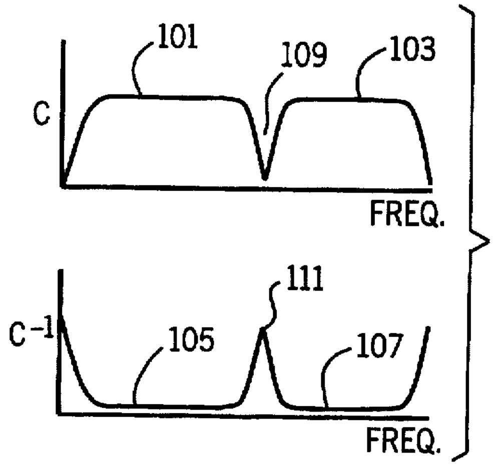
FIG. 8 is a graph showing frequency versus output and illustrates performance of the system of FIG. 7.

As seen in FIG. 8, at frequencies where maximum power from output transducer 14 reaches error transducer 16, as at frequency regions 101 and 103, C model 142 has a maximum transfer characteristic, and the inverse of the C model at 95 has a minimum transfer characteristic, as shown at 105 and 107. The minimum transfer characteristic at 105 and 107 minimizes leakage of the update signal to model 40, to enable maximum output of model 40. At frequencies where minimum power from output transducer 14 reaches error transducer 16, as at region 109, C model 142 has a minimum transfer characteristic, and the inverse of the C model at 95 has a maximum transfer characteristic, as shown at 111. The maximum transfer characteristic at 111 maximizes leakage of the update signal, to minimize the output of model 40. Inverse C model 95 spectrally senses correction signal 46 and provides selective leakage of weight update signal 74 in response thereto, to control performance of model 40 according to frequency, to optimize performance of model 40 in frequency ranges such as 101 and 103 where the model can effectively control or cancel input signal 6. Outside of such ranges, e.g. at 109, inverse C model 95 minimizes performance of model 40, to avoid using computation or adaptation power where inefficient or unneeded, and to prevent the model from continually trying to generate an output in regions where it is ineffective to attempt to control or cancel input signal 6. Model 95 affords frequency weighting of the weight update signal.

FIG. 9 is similar to FIG. 5 of U.S. Pat. No. 4,677,676, incorporated herein by reference, and uses like reference numerals to facilitate understanding. The system introduces a control signal from an output transducer 14, such as a loudspeaker, shaker, or other actuator or controller, to combine with the system input signal 6 and yield a system output signal 8. An input transducer 10, such as a microphone, accelerometer, or other sensor, senses the system input signal. An error transducer 16, such as a microphone, accelerometer, or other sensor, senses the system output signal and provides an error signal. Adaptive filter model 40 adaptively models the system and has a model input 42 from input transducer 10, an error input 44 from error transducer 16, and a model output 46 outputting a correction signal to output transducer 14 to introduce the control signal. In a known alternative, the input signal at 42 may be provided by one or more error signals, in the case of a periodic system input signal, "Active Adaptive Sound Control In A Duct: A Computer Simulation", J. C. Burgess, Journal of Acoustic Society of America, 70(3), September 1981, pages 715–726, U.S. Pat. Nos. 5,206,911, 5,216,722, incorporated herein by reference.

The system of the '698 application provides an active adaptive control system wherein the performance of model 40 is intentionally and selectively constrained by driving the output 46 of the model towards zero in response to a given condition of a given parameter. For example, in an active noise control system, it may be desirable to cancel noise only in a given frequency band, and leave the noise uncanceled for frequencies outside the band. In other control applications, it may be desirable to selectively control the system output signal by selectively controlling introduction of the control signal from output transducer 14 to match or not match the system input signal.

One manner of constraining system performance is to drive the output of model 40 towards zero and away from a value matching system input signal 6. One way of accomplishing this is shown in FIG. 10 wherein the output of model 40 is supplied to its error input, such that when the model adapts to drive its error input towards zero, the output of the model is necessarily also driven towards zero. FIG. 11 shows another manner of implementing this principle wherein a copy of the model at is provided at 200, and the output of model copy 200 supplies the error signal to the error input of model 40. In FIG. 11, model 40 adapts to drive its error input towards zero, which in turn requires that the output of copy 200 be driven towards zero, which in turn means that the output of model 40 is driven towards zero because M copy 200 is a duplicate of model 40. These principles are utilized in the present invention.

Model 40, FIG. 12, normally adapts to a converged condition wherein its output at 46 provides a correction signal to output transducer 14 which outputs a control signal matching the system input signal or a designated relative value correlated thereto. For example, in a noise cancellation system, the matching control signal from output transducer 14 cancels the input noise. In the system of the '698 application, in response to a given condition of a given parameter, the output of model 40 is driven towards zero by driving the output of the model towards its error input, such that when the model adapts to drive the error signal towards zero, the output of the model is also driven towards zero. This is accomplished by providing a copy 200 of model 40, and supplying the output of the copy to an error input 202 of the model which is summed at summer 204 with the error signal at error input 44 from error transducer 16. The model adapts to drive the error input towards zero which in turn requires that the output of copy 200 and hence the output of model 40 are driven towards zero, to provide the noted constrained performance. The driving of model output 46 towards zero provides a zero or at least a reduced correction signal to output transducer 14 to constrain or reduce modification and/or cancellation of the system input signal 6.

A random signal is provided at 206 from an auxiliary random signal source 208, preferably provided by a Galois sequence, M. R. Schroeder, "Number Theory In Science And Communications", Berlin, Springer-Berlag, 1984, pages 252–261, though other random signal sources may be used, uncorrelated with the system input signal 6. The Galois sequence is a pseudo random sequence that repeats after $2^M-1$ points, where M is the number of stages in a shift register. The Galois sequence is preferred because it is easy to calculate and can easily have a period much longer than the response time of the system. The random signal is supplied through a stopband filter 210 to model copy 200 at 212. Stopband filter 210 blocks frequencies in the stopband, and passes frequencies outside the stopband. This arrangement provides a spectral leak signal at 202 in response to a given condition of a given parameter, for example a frequency outside the stopband. In such implementation, the noted given parameter is frequency, and the given condition is a designated sub-optimum performance band outside the stopband.

The spectral leak error signal at 202 drives the correction signal at model output 46 towards zero and provides sub-optimum performance of model 40. Outside of the sub-optimum performance band, i.e. within the stopband of filter 210, there is no signal at 212 and hence the output of copy 200 is undefined, and the error signal from error transducer 16 at error input 44 is maximally effective and model 40 optimally responds thereto and drives the correction signal at output 46 toward a value matching the system input signal 6. When the spectral leak signal is present at error input 202, it constrains performance of model 40 by driving or at least attempting to drive the correction signal at model output 46 towards zero. The relative influence or amplitudes of the error signals at error inputs 44 and 202 are adjusted to provide the desired relative dominance. Where it is desired to eliminate all modification and/or cancellation of the system input signal when the frequency is outside the stopband of filter 210, then the noted relative amplitudes are set such that the error signal at error input 202 dominates the error signal at error input 44, and hence the correction signal at model output 46 is driven towards zero and away from a value matching the system input signal 6.

The method of the '698 application involves driving error input 44 to drive the correction signal at model output 46 toward a value matching the system input signal, and selectively driving error input 202 to drive the correction signal at model output 46 away from the matching value by driving the correction signal towards zero. The arrangement provides a spectral leak signal to error input 202 in response to the noted given condition of the given parameter, e.g. a frequency outside the stopband, such that in the presence of the given condition, the spectral leak signal drives the correction signal at model output 46 towards zero, and in the absence of the given condition the error signal at error input 44 drives the correction signal at model output 46 towards a value matching the system input signal 6.

Stopband filter 210 blocks frequencies in a given stopband at which modification or cancellation of the system input signal 6 by model 40 is desired. Filter 210 passes frequencies in a given passband at which modification or cancellation of the system input signal by model 40 is undesired or not possible. The control signal output by output transducer 14 is driven toward a value matching the system input signal 6 only for frequencies in the stopband. At frequencies in the stopband, the error signal at error input 44 is dominant, and the control signal output by output transducer 14 is driven toward a value matching the system input signal 6. At frequencies in the passband, the error signal at error input 202 is dominant, and the control signal output by output transducer 14 is driven away from a value matching the system input signal 6.

Figure 13:
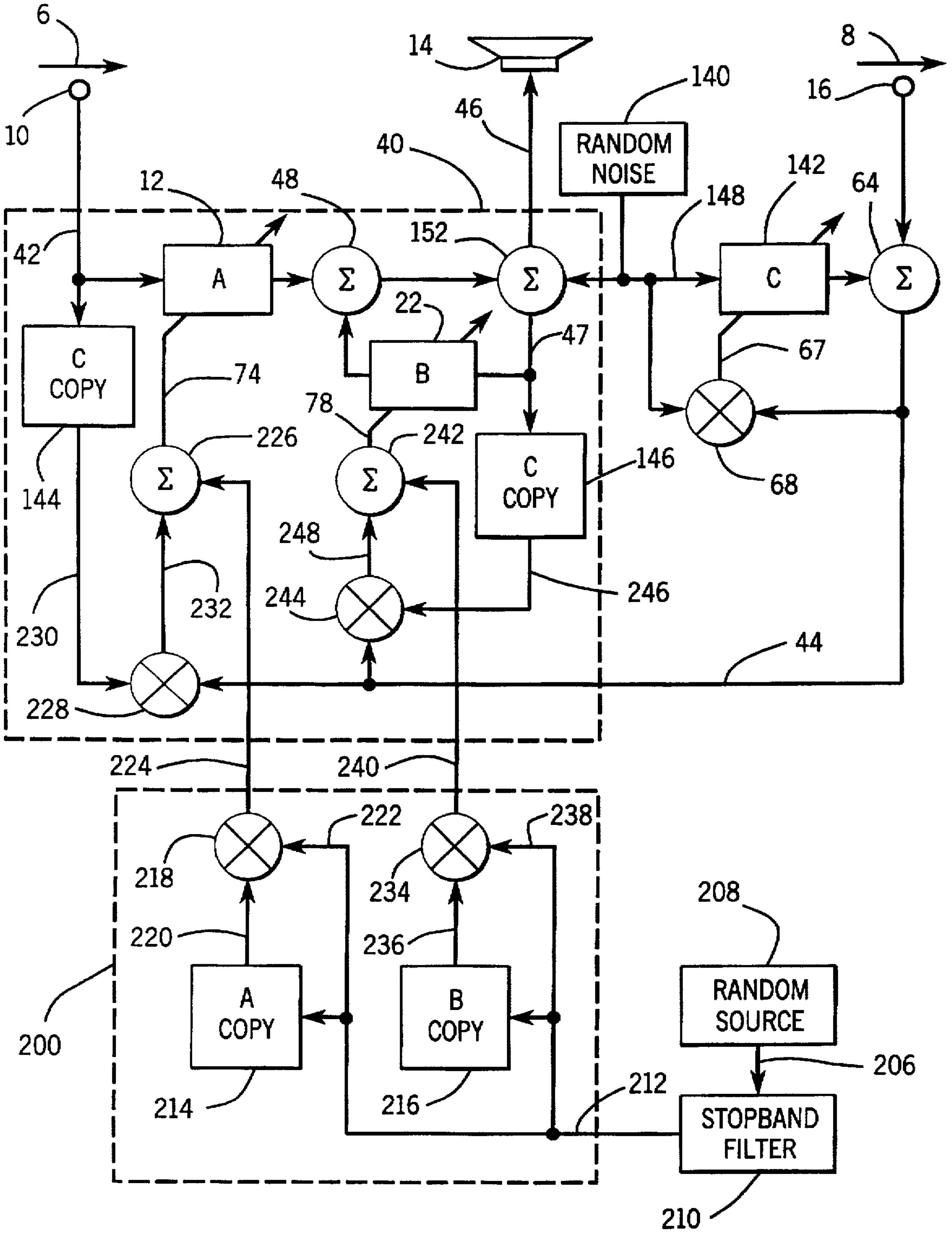
FIG. 13 shows a further embodiment of the system of FIG. 12.

FIG. 13 is similar to FIGS. 19 and 20 of the incorporated '676 patent, and uses like reference numerals where appropriate to facilitate understanding. As noted in the incorporated '676 patent, model M at 40 is preferably an adaptive recursive filter having a transfer function with both poles and zeros. Model M is provided by an IIR, infinite impulse response, filter, e.g. a recursive least mean square, RLMS, filter having a first algorithm filter provided by an FIR, finite impulse response, filter, e.g. a least mean square, LMS, filter A at 12, and a second algorithm filter provided by an FIR filter, e.g. an LMS filter, B at 22. Filter A provides a direct transfer function, and filter B provides a recursive transfer function. The transfer function from output transducer 14 to error transducer 16 is modeled by a filter, e.g. an LMS or RLMS filter, C at 142, as in the incorporated '676 patent.

Auxiliary random signal source 140 introduces a random signal into the output of model 40 at summer 152 and into the C model at 148. The auxiliary random signal from source 140 is random and uncorrelated with the system input signal 6, and is also uncorrelated with auxiliary random signal source 208, and in preferred form is provided by a Galois sequence, M. R. Schroeder, "Number Theory In Science And Communications", Berlin, Springer-Berlag, 1984, pages 252–261, though other random uncorrelated signal sources may be used. The Galois sequence is a pseudo random sequence that repeats after $2^M-1$ points, where M is the number of stages in a shift register. The Galois sequence is preferred because it is easy to calculate and can easily have a period much longer than the response time of the system. The input 148 to C model 142 is multiplied with the error signal from error transducer 16 at multiplier 68, and the resultant product provided as weight update signal 67. Model 142 models the transfer function from output transducer 14 to error transducer 16, including the transfer function of each. Alternatively, the transfer function from output transducer 14 to error transducer 16 may be modeled without a random signal source, as in U.S. Pat. No. 4,987, 598, incorporated herein by reference. Auxiliary source 140 introduces an auxiliary random signal such that error transducer 16 also senses the auxiliary signal from the auxiliary source. The auxiliary signal may be introduced into the recursive loop of the A and B filters as in FIG. 19 of the incorporated '676 patent at summer 152, or alternatively the auxiliary signal may be introduced into the model after the recursive loop, i.e. introducing the auxiliary signal only to line 46, and not to line 47. As in the incorporated '676 patent, copies of model 142 are provided at 144 and 146 to compensate the noted transfer function.

The outputs of filters A and B are summed at summer 48, whose output is summed at summer 152 with the output of random signal source 140 to provide an output resultant sum which provides the model output at 46 supplying the noted correction signal to output transducer 14. The output of model 142 is summed at summer 64 with the output of error transducer 16, and the resultant sum supplied as the error input to model 142 and as an error input to model 40. Alternatively, the output of error transducer 16 may be supplied directly to an error input of model 40 without being supplied through summer 64.

M copy 200, FIG. 12, is provided by a copy of A filter 12 at A copy 214, FIG. 13, and a copy of B filter 22 at B copy 216. Multiplier 218 multiplies the output 220 of A copy 214 and the input 222 of A copy 214, and supplies the output resultant product at 224 to summer 226. Multiplier 228 multiplies the output 230 of C copy 144 and the error input at 44, and supplies the output resultant product at 232 to summer 226. Summer 226 sums the inputs 232 and 224, and supplies the output resultant sum as weight update signal 74 to A filter 12. Multiplier 234 multiplies the output 236 of B copy 216 and the input 238 of B copy 216, and supplies the output resultant product at 240 to summer 242. Multiplier 244 multiplies the output 246 of C copy 146 and the error input at 44, and supplies the output resultant product at 248 to summer 242. The summer 242 sums the inputs 248 and 240, and supplies the output resultant sum as weight update signal 78 to B filter 22. The input to A copy 214 and to B copy 216 is provided by the output 212 of stopband filter 210 receiving the noted random input signal at 206 from random signal source 208.

The error signals at error inputs 232 and 224 oppositely drive the model. The error signal at error input 232 of the direct transfer function filter A drives the correction signal at 46 towards a value matching the system input signal 6. The error signal at error input 224 of filter A drives the correction signal at 46 away from the noted matching value by driving the correction signal towards zero. As noted above, this is accomplished by using a copy 214 of the A filter and supplying the output of such copy as an error input to the adaptive model such that in attempting to drive the error input to zero, the model must drive its output to zero. The signal at error input 224 is provided only in response to a given condition of a given parameter, e.g. when the frequency is outside the stopband of filter 210. The relative amplitudes of the input signals at error inputs 232 and 224 are adjusted such that the signal at error input 224 dominates when both are present, or the degree of dominance is adjusted to in turn adjust the amount of constrainment of performance of the model so that the correction signal at 46 is driven towards zero but never reaches zero, such that there is still some modification and/or cancellation of the system input signal, though to a reduced degree. When the frequency is in the stopband of filter 210, there is no output at 212, and hence no input to A copy 214 and hence the latter's output is undefined, whereby error input 232 from error signal 44 from error transducer 16 dominates and hence drives correction signal 46 to a value which matches the system input signal 6 to provide modification and/or control of the latter. The error inputs 248 and 240 to the recursive transfer function filter B of model 40 function comparably to error inputs 232 and 224, respectively. Model 40 has a first error input provided at 232 and 248 from error transducer 16 driving the output of the model towards a value matching the system input signal 6. Model 40 has a second error input at 224 and 240 selectively driving the output of model 40 away from such matching value and instead driving the correction signal 46 towards zero.

Figure 14:
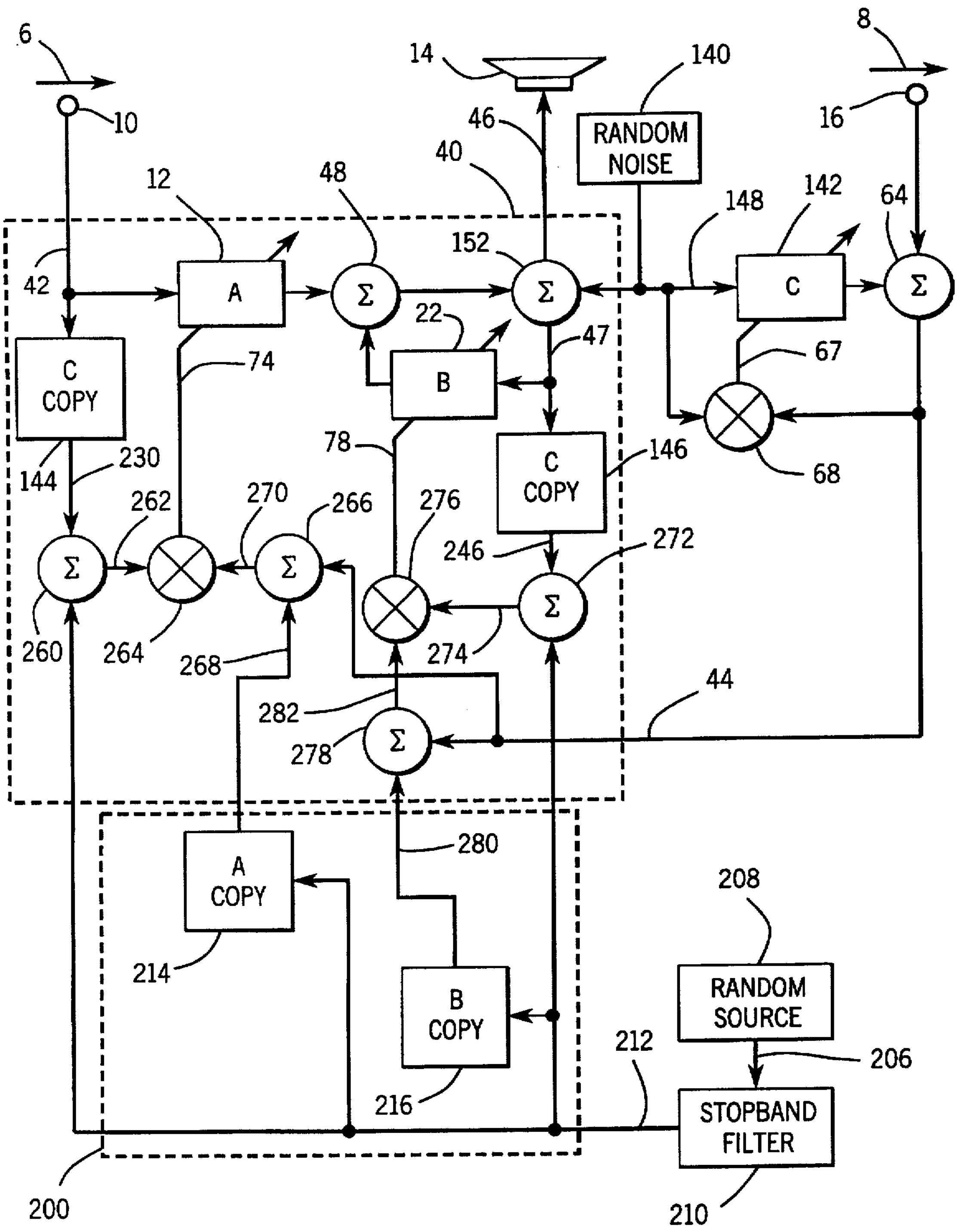
FIG. 14 shows a further embodiment of the system of FIG. 12.

FIG. 14 is similar to FIG. 13 and uses like reference numerals where appropriate to facilitate understanding. Summer 260 sums the output 230 of C copy 144 and the output 212 of stopband filter 210 which supplies the input to A copy 214, and supplies the output resultant sum at 262 to multiplier 264. Summer 266 sums the output 268 of A copy 214 and the error input at 44, and supplies the output resultant sum at 270 to multiplier 264. Multiplier 264 multiplies the inputs 262 and 270, and supplies the output resultant product as weight update signal 74 to A filter 12. Summer 272 sums the output 246 of C copy 146 and the output 212 of stopband filter 210 which supplies the input to B copy 216, and supplies the output resultant sum at 274 to multiplier 276. Summer 278 sums the output 280 of B copy 216 and the error input at 44, and supplies the output resultant sum at 282 to multiplier 276. Multiplier 276 multiplies inputs 282 and 274, and supplies the output resultant product as weight update signal 78 to B filter 22.

The error signals at 44 and 268 oppositely drive the model. The error signal at error input 44 of the direct transfer function filter A drives the correction signal at 46 towards a value matching the system input signal 6. The error signal at error input 268 of filter A drives the correction signal at 46 away from the noted matching value by driving the correction signal towards zero. As noted above, this is accomplished by using a copy 214 of the A filter and supplying the output of such copy as an error input to the adaptive model such that in attempting to drive the error input to zero, the model must drive its output to zero. The signal at error input 268 is provided only in response to a given condition of a given parameter, e.g., when the frequency is outside the stopband of filter 210. The relative amplitudes of the input signals at error inputs 44 and 268 to summer 266 are adjusted such that the signal at error input 268 dominates when both are present, or the degree of dominance is adjusted to in turn adjust the amount of constrainment of performance of the model so that the correction signal at 46 is driven towards zero but never reaches zero, such that there is still some modification and/or cancellation of the system input signal, though to a reduced degree. When the frequency is in the stopband of filter 210, there is no output at 212, and hence no input to A copy 214 and hence the latter's output is undefined, whereby error input 44 to summer 266 from error transducer 16 dominates and hence the model drives correction signal 46 to a value which matches the system input signal 6 to provide modification and/or control of the latter. The error inputs 44 and 280 at summer 278 to the recursive transfer function filter B of model 40 function comparably to error inputs 44 and 268 at summer 266, respectively. Model 40 in FIG. 14 has a first error input provided at 44 to summers 266 and 278 from error transducer 16 driving the output of the model towards a value matching the system input signal 6. Model 40 has a second error input at 268 and 280 selectively driving the output of model 40 away from such matching value and instead driving the correction signal 46 towards zero.

Figure 15:
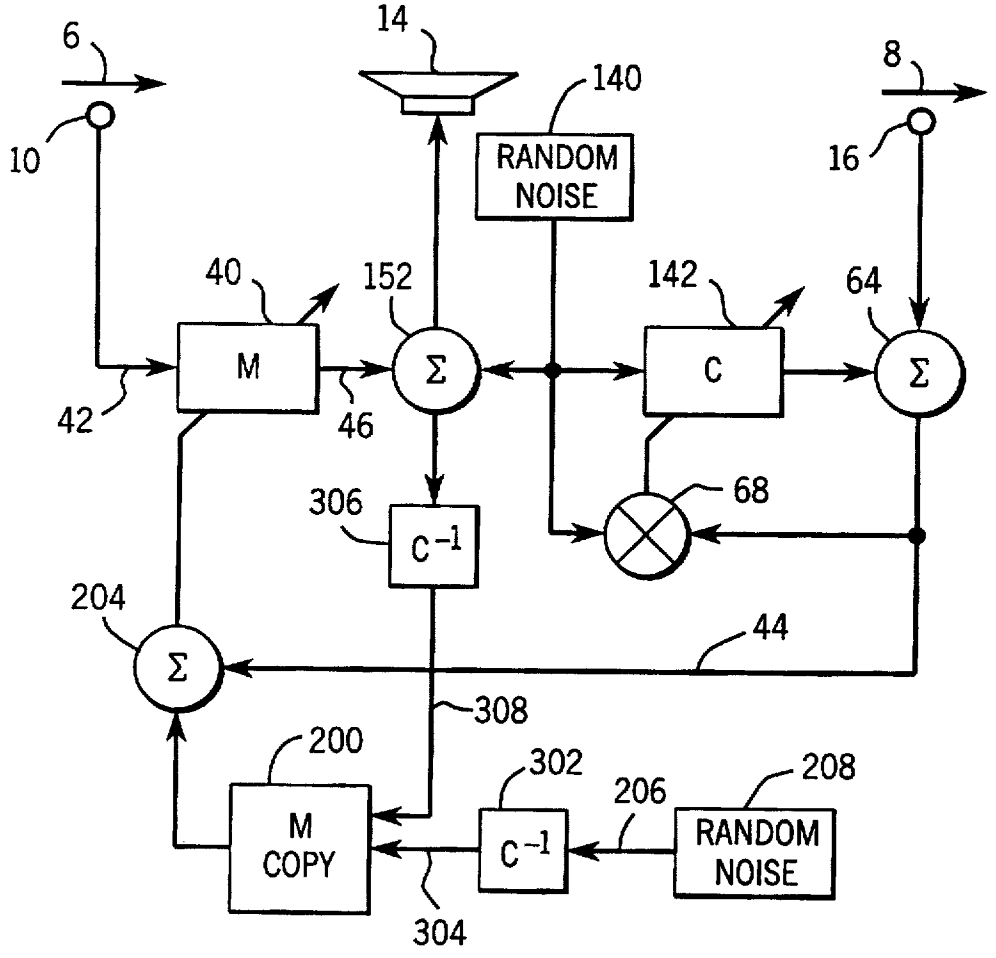
FIG. 15 is a schematic illustration of an active adaptive control system in accordance with the present invention.

FIG. 15 illustrates the present invention and uses like reference numerals from above and from FIGS. 19 and 20 of the incorporated '676 patent. Random noise signal 206 from random noise source 208 is supplied through a first inverse C model copy 302 whose output is supplied to the filter input 304 of M copy 200. Correction signal 46 from the output of model 40 through summer 152 is supplied through a second inverse C model copy 306 to the convergence rate gain control input 308 of M copy 200. The spectral transfer function provided by filter 302 spectrally controls performance of model 40 to maximize the correction signal at frequencies of interest. In preferred form, the spectral transfer function is the inverse C model copy having the characteristics shown in FIG. 8, though other frequency responsive spectral transfer functions may be used. The spectral leak signal provided through transfer functions 302 and 200 degrades performance of model 40, as above described in conjunction with FIG. 12. Transfer function 302 controls the leak signal according to frequency. It is preferred that the leak signal also be controlled in response to the correction signal from the output of model 40. Transfer function 306 spectrally monitors the correction signal and filters same to provide a spectral control signal controlling the gain through M copy 200. Transfer function 306 and the gain control provided at control input 308 are optional. The spectral leak control provided through transfer function 302 to filter input 304 may be used with or without transfer function 306 and control input 308. Filter input 304 of M copy 200 receives a spectrally processed input signal from spectral transfer function 302. Control input 308 of M copy 200 controls gain of M copy 200 and receives a spectral control signal from transfer function 306. The spectral control signal is responsive to correction signal 46. Spectral transfer functions 302 and 306 may be the same, as shown, or may be different.

Figure 16:
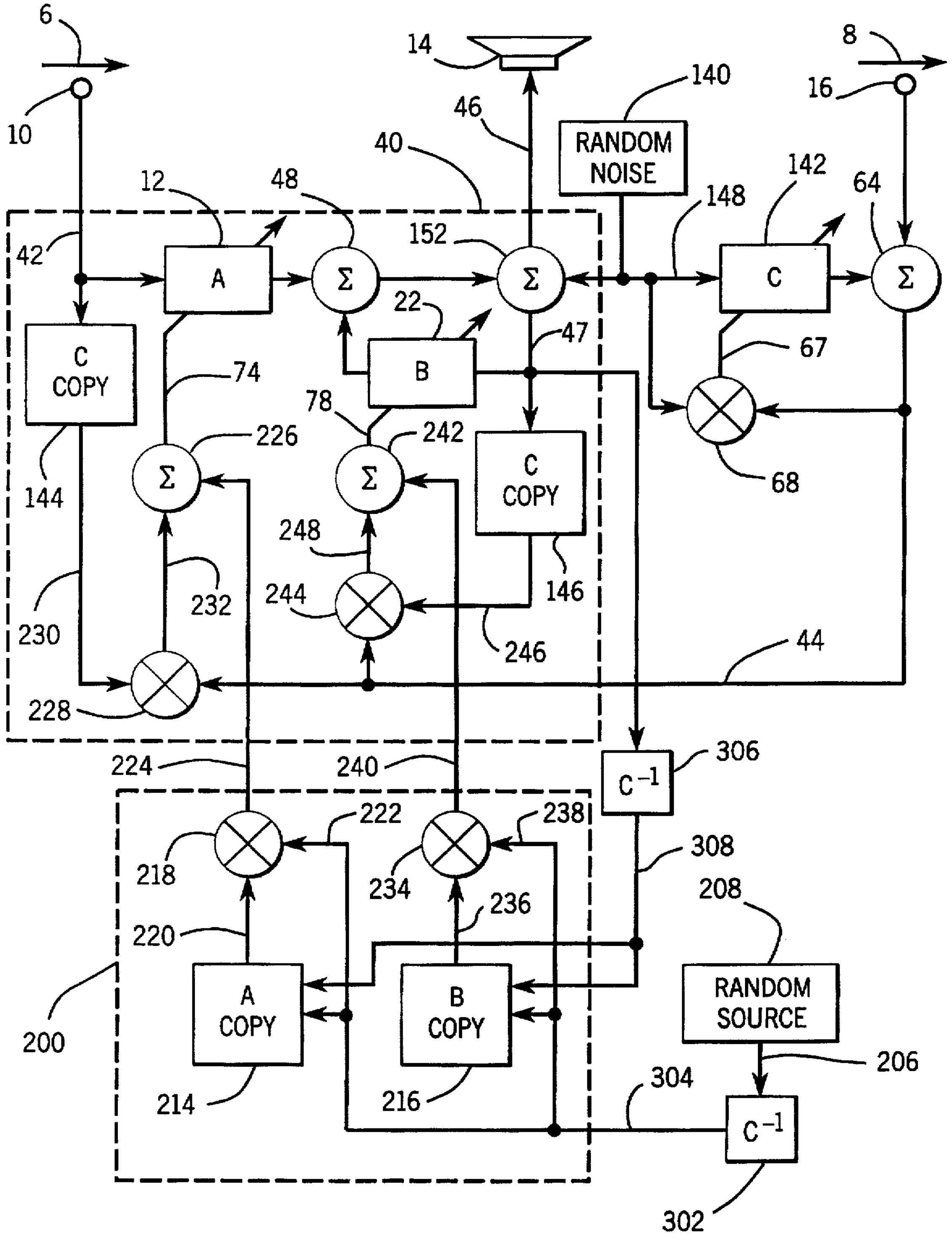
FIG. 16 shows a further embodiment of the system of FIG. 15.

FIG. 16 uses like reference numerals from above and from FIGS. 19 and 20 of the incorporated '676 patent. As noted in the incorporated '676 patent, model M at 40 is preferably an adaptive recursive filter having a transfer function with both poles and zeros. Model M is provided by an IIR, infinite impulse response, filter, e.g. a recursive least mean square, RLMS, filter having a first algorithm filter provided by an FIR, finite impulse response, filter, e.g. a least mean square, LMS, filter A at 12, and a second algorithm filter provided by an FIR filter, e.g. an LMS filter, B at 22. Filter A provides a direct transfer function, and filter B provides a recursive transfer function. The transfer function from output transducer 14 to error transducer 16 is modeled by a filter, e.g. an LMS or RLMS filter, C at 142, as in the incorporated '676 patent.

Auxiliary random signal source 140 introduces a random signal into the output of model 40 at summer 152 and into the C model at 148. The auxiliary random signal from source 140 is random and uncorrelated with the system input signal 6, and is also uncorrelated with auxiliary random signal source 208, and in preferred form is provided by a Galois sequence, M. R. Schroeder, "Number Theory In Science And Communications", Berlin, Springer-Berlag, 1984, pages 252–261, though other random uncorrelated signal sources may be used. The Galois sequence is a pseudo random sequence that repeats after $2^{M}-1$ points, where M is the number of stages in a shift register. The Galois sequence is preferred because it is easy to calculate and can easily have a period much longer than the response time of the system. The input 148 to C model 142 is multiplied with the error signal from error transducer 16 at multiplier 68, and the resultant product provided as weight update signal 67. Model 142 models the transfer function from output transducer 14 to error transducer 16, including the transfer function of each. Alternatively, the transfer function from output transducer 14 to error transducer 16 may be modeled without a random signal source, as in U.S. Pat. No. 4,987,598, incorporated herein by reference. Auxiliary source 140 introduces an auxiliary random signal such that error transducer 16 also senses the auxiliary signal from the auxiliary source. The auxiliary signal may be introduced into the recursive loop of the A and B filters as in FIG. 19 of the incorporated '676 patent at summer 152, or alternatively the auxiliary signal may be introduced into the model after the recursive loop, i.e. introducing the auxiliary signal only to line 46, and not to line 47. As in the incorporated '676 patent, copies of model 142 are provided at 144 and 146 to compensate the noted transfer function.

The outputs of filters A and B are summed at summer 48, whose output is summed at summer 152 with the output of random signal source 140 to provide an output resultant sum which provides the model output at 46 supplying the noted correction signal to output transducer 14. The output of model 142 is summed at summer 64 with the output of error transducer 16, and the resultant sum supplied as the error input to model 142 and as an error input to model 40. Alternatively, the output of error transducer 16 may be supplied directly to an error input of model 40 without being supplied through summer 64.

M copy 200, FIG. 15, is provided by a copy of A filter 12 at A copy 214, FIG. 16, and a copy of B filter 22 at B copy 216. Multiplier 218 multiplies the output 220 of A copy 214 and the input 222 supplies the 14, and supplies the output resultant product at 224 to summer 226. Multiplier 228 multiplies the output 230 of C copy 144 and the error input at 44, and supplies the output resultant product at 232 to summer 226. Summer 226 sums the inputs 232 and 224, and supplies the output resultant sum as weight update signal 74 to A filter 12. Multiplier 234 multiplies the output 236 of B copy 216 and the input 238 of B copy 216, and supplies the output resultant product at 240 to summer 242. Multiplier 244 multiplies the output 246 of C copy 146 and the error input at 44, and supplies the output resultant product at 248 to summer 242. The summer 242 sums the inputs 248 and 240, and supplies the output resultant sum as weight update signal 78 to B filter 22. The input to A copy 214 and to B copy 216 is provided by the output 304 of filter 302 receiving the noted random input signal at 206 from random signal source 208.

The error signals at error inputs 232 and 224 oppositely drive the model. The error signal at error input 232 of the direct transfer function filter A drives the correction signal at 46 towards a value matching the system input signal 6. The error signal at error input 224 of filter A drives the correction signal at 46 away from the noted matching value by driving the correction signal towards zero. As noted above, this is accomplished by using a copy 214 of the A filter and supplying the output of such copy as an error input to the adaptive model such that in attempting to drive the error input to zero, the model must drive its output to zero. The signal at error input 224 is provided only in response to a given condition of a given parameter, e.g. when the frequency is in the ranges passed by filter 302. The relative amplitudes of the input signals at error inputs 232 and 224 are adjusted such that the signal at error input 224 dominates when both are present, or the degree of dominance is adjusted to in turn adjust the amount of constrainment of performance of the model so that the correction signal at 46 is driven towards zero but never reaches zero, such that there is still some modification and/or cancellation of the system input signal, though to a reduced degree. When the frequency is outside of the ranges passed by filter 302, there is no output at 212, and hence no input to A copy 214 and hence the latter's output is undefined, whereby error input 232 from error signal 44 from error transducer 16 dominates and hence drives correction signal 46 to a value which matches the system input signal 6 to provide modification and/or control of the latter. The gain is controlled by the control signal at control input 308 which is the spectrally processed correction signal supplied through the transfer function filter provided by inverse C model copy 306. The error inputs 248 and 240 to the recursive transfer function filter B of model 40 function comparably to error inputs 232 and 224, respectively. Model 40 has a first error input provided at 232 and 248 from error transducer 16 driving the output of the model towards a value matching the system input signal 6. Model 40 has a second error input at 224 and 240 selectively driving the output of model 40 away from such matching value and instead driving the correction signal 46 towards zero.

Figure 17:
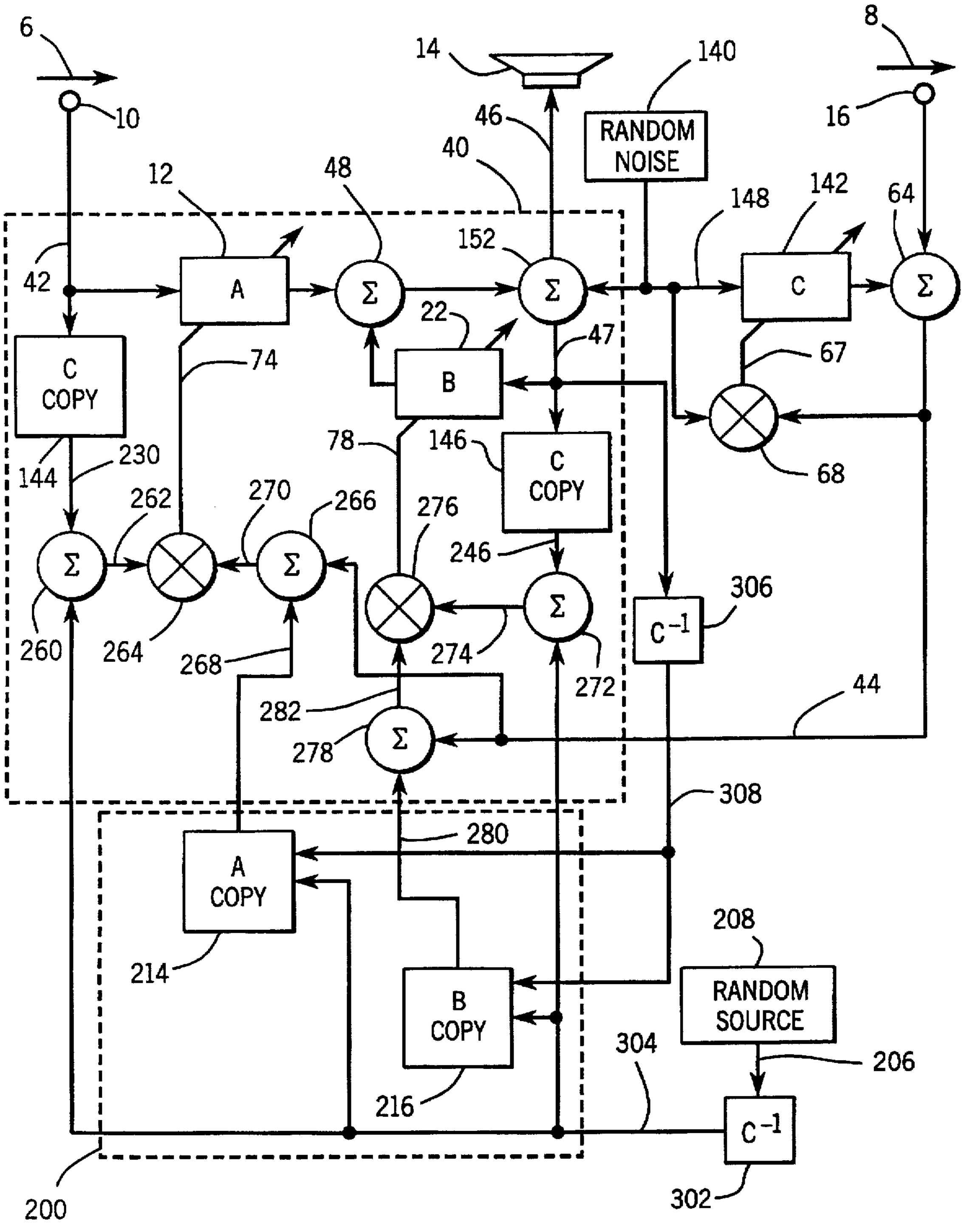
FIG. 17 shows a further embodiment of the system of FIG. 15.

FIG. 17 uses like reference numerals from above and from FIGS. 19 and 20 of the incorporated '676 patent. Summer 260 sums the output 230 of C copy 144 and the output 212 of stopband filter 210 which supplies the input to A copy 214, and supplies the output resultant sum at 262 to multiplier 264. Summer 266 sums the output 268 of A copy 214 and the error input at 44, and supplies the output resultant sum at 270 to multiplier 264. Multiplier 264 multiplies the inputs 262 and 270, and supplies the output resultant product as weight update signal 74 to A filter 12. Summer 272 sums the output 246 of C copy 146 and the output 304 of filter 302 which supplies the input to B copy 216, and supplies the output resultant sum at 274 to multiplier 276. Summer 278 sums the output 280 of B copy 216 and the error input at 44, and supplies the output resultant sum at 282 to multiplier 276. Multiplier 276 multiplies inputs 282 and 274, and supplies the output resultant product as weight update signal 78 to B filter 22.

The error signals at 44 and 268 oppositely drive the model. The error signal at error input 44 of the direct transfer function filter A drives the correction signal at 46 towards a value matching the system input signal 6. The error signal at error input 268 of filter A drives the correction signal at 46 away from the noted matching value by driving the correction signal towards zero. As noted above, this is accomplished by using a copy 214 of the A filter and supplying the output of such copy as an error input to the adaptive model such that in attempting to drive the error input to zero, the model must drive its output to zero. The signal at error input 268 is provided only in response to a given condition of a given parameter, e.g., when the frequency is in the ranges passed by transfer function filter 302. The relative amplitudes of the input signals at error inputs 44 and 268 to summer 266 are adjusted such that the signal at error input 268 dominates when both are present, or the degree of dominance is adjusted to in turn adjust the amount of constrainment of performance of the model so that the correction signal at 46 is driven towards zero but never reaches zero, such that there is still some modification and/or cancellation of the system input signal, though to a reduced degree. When the frequency is outside of the ranges passed by filter 302, there is no output at 212, there is no output at 212, and hence no input to A copy 214 and hence the latter's output is undefined, whereby error input 44 to summer 266 from error transducer 16 dominates and hence the model drives correction signal 46 to a value which matches the system input signal 6 to provide modification and/or control of the latter. The gain is controlled by the control signal at control input 308 provided by the spectrally processed correction signal supplied through the transfer function filter provided by inverse C model copy 306. The error inputs 44 and 280 at summer 278 to the recursive transfer function filter B of model 40 function comparably to error inputs 44 and 268 at summer 266, respectively. Model 40 in FIG. 6 has a first error input provided at 44 to summers 266 and 278 from error transducer 16 driving the output of the model towards a value matching the system input signal 6. Model 40 has a second error input at 268 and 280 selectively driving the output of model 40 away from such matching value and instead driving the correction signal 46 towards zero.

Figure 18:
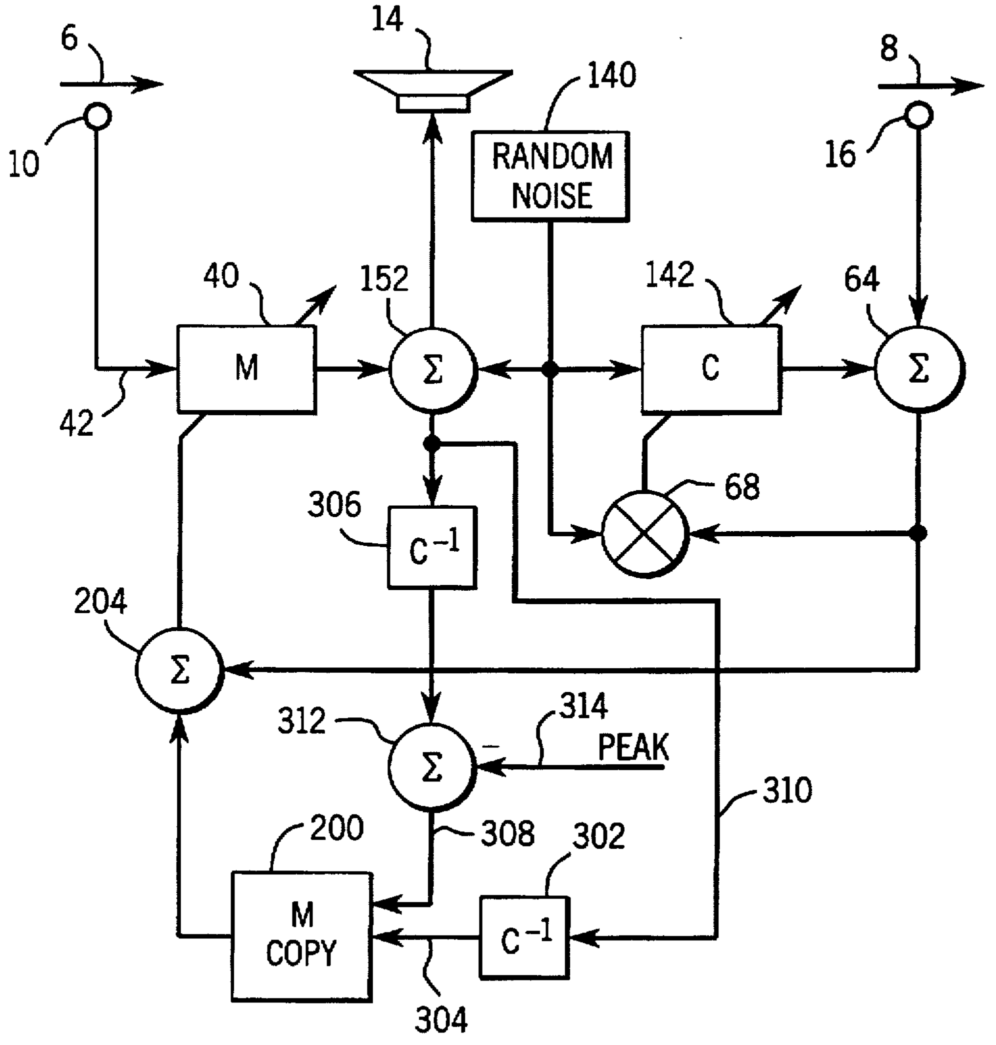
FIG. 18 is a schematic illustration of an active adaptive control system in accordance with the present invention.

FIG. 18 illustrates the present invention and uses like reference numerals from above and from FIGS. 19 and 20 of the incorporated '676 patent. In FIG. 18, spectral transfer function filter 302 has its input 310 supplied from the correction signal from the output of model 40, rather than from random noise signal source 208, FIG. 15. The spectral transfer function provided by filter 306 also includes a peak detector 312 similar to peak detector 97, FIG. 7. The output of inverse C model 306 is supplied to peak detector 312 comparing the output of inverse C model 306 with a desired peak value 314. When the output of inverse C model copy 306 rises above the level of peak value 314, the positive output of summer 312 at the control input 308 controls the gain of M copy 200 to in turn control the gain of the leak signal at filter input 304 supplied through the spectral transfer function 302.

FIG. 19 uses like reference numerals from above and from FIGS. 19 and 20 of the incorporated '676 patent. As noted in the incorporated '676 patent, model M at 40 is preferably an adaptive recursive filter having a transfer function with both poles and zeros. Model M is provided by an IIR, infinite impulse response, filter, e.g. a recursive least mean square, RLMS, filter having a first algorithm filter provided by an FIR, finite impulse response, filter, e.g. a least mean square, LMS, filter A at 12, and a second algorithm filter provided by an FIR filter, e.g. an LMS filter, B at 22. Filter A provides a direct transfer function, and filter B provides a recursive transfer function. The transfer function from output transducer 14 to error transducer 16 is modeled by a filter, e.g. an LMS or RLMS filter, C at 142, as in the incorporated '676 patent.

Auxiliary random signal source 140 introduces a random signal into the output of model 40 at summer 152 and into the C model at 148. The auxiliary random signal from source 140 is random and uncorrelated with the system input signal 6, and is also uncorrelated with auxiliary random signal source 208, and in preferred form is provided by a Galois sequence, M. R. Schroeder, "Number Theory In Science And Communications", Berlin, Springer-Berlag, 1984, pages 252–261, though other random uncorrelated signal sources may be used. The Galois sequence is a pseudo random sequence that repeats after $2^{M}-1$ points, where M is the number of stages in a shift register. The Galois sequence is preferred because it is easy to calculate and can easily have a period much longer than the response time of the system. The input 148 to C model 142 is multiplied with the error signal from error transducer 16 at multiplier 68, and the resultant product provided as weight update signal 67. Model 142 models the transfer function from output transducer 14 to error transducer 16, including the transfer function of each. Alternatively, the transfer function from output transducer 14 to error transducer 16 may be modeled without a random signal source, as in U.S. Pat. No. 4,987,598, incorporated herein by reference.. Auxiliary source 140 introduces an auxiliary random signal such that error transducer 16 also senses the auxiliary signal from the auxiliary source. The auxiliary signal may be introduced into the recursive loop of the A and B filters as in FIG. 19 of the incorporated '676 patent at summer 152, or alternatively the auxiliary signal may be introduced into the model after the recursive loop, i.e. introducing the auxiliary signal only to line 46, and not to line 47. As in the incorporated '676 patent, copies of model 142 are provided at 144 and 146 to compensate the noted transfer function.

The outputs of filters A and B are summed at summer 48, whose output is summed at summer 152 with the output of random signal source 140 to provide an output resultant sum which provides the model output at 46 supplying the noted correction signal to output transducer 14. The output of model 142 is summed at summer 64 with the output of error transducer 16, and the resultant sum supplied as the error input to model 142 and as an error input to model 40. Alternatively, the output of error transducer 16 may be supplied directly to an error input of model 40 without being supplied through summer 64.

M copy 200, FIG. 18, is provided by a copy of A filter 12 at A copy 214, FIG. 19, and a copy of B filter 22 at B copy 216. Multiplier 218 multiplies the output 220 of A copy 214 and the input 222 of A copy 214, and supplies the output resultant product at 224 to summer 226. Multiplier 228 multiplies the output 230 of C copy 144 and the error input at 44, and supplies the output resultant product at 232 to summer 226. Summer 226 sums the inputs 232 and 224, and supplies the output resultant sum as weight update signal 74 to A filter 12. Multiplier 234 multiplies the output 236 of B copy 216 and the input 238 of B copy 216, and supplies the output resultant product at 240 to summer 242. Multiplier 244 multiplies the output 246 of C copy 146 and the error input at 44, and supplies the output resultant product at 248 to summer 242. The summer 242 sums the inputs 248 and 240, and supplies the output resultant sum as weight update signal 78 to B filter 22. The input to A copy 214 and to B copy 216 is provided by the output 304 of filter 302 receiving the model output at 47.

The error signals at error inputs 232 and 224 oppositely drive the model. The error signal at error input 232 of the direct transfer function filter A drives the correction signal at 46 towards a value matching the system input signal 6. The error signal at error input 224 of filter A drives the correction signal at 46 away from the noted matching value by driving the correction signal towards zero. As noted above, this is accomplished by using a copy 214 of the A filter and supplying the output of such copy as an error input to the adaptive model such that in attempting to drive the error input to zero, the model must drive its output to zero. The signal at error input 224 is provided only in response to a given condition of a given parameter, e.g. when the frequency is in the ranges passed by filter 302. The relative amplitudes of the input signals at error inputs 232 and 224 are adjusted such that the signal at error input 224 dominates when both are present, or the degree of dominance is adjusted to in turn adjust the amount of constrainment of performance of the model so that the correction signal at 46 is driven towards zero but never reaches zero, such that there is still some modification and/or cancellation of the system input signal, though to a reduced degree. When the frequency is outside of the ranges passed by filter 302, there is no output at 212, and hence no input to A copy 214 and hence the latter's output is undefined, whereby error input 232 from error signal 44 from error transducer 16 dominates and hence drives correction signal 46 to a value which matches the system input signal 6 to provide modification and/or control of the latter. The gain is controlled at control input 308 by the control signal supplied from peak detector 312 and filter 306 which supplies the spectrally processed correction signal based on the model output at 47. The error inputs 248 and 240 to the recursive transfer function filter B of model 40 function comparably to error inputs 232 and 224, respectively. Model 40 has a first error input provided at 232 and 248 from error transducer 16 driving the output of the model towards a value matching the system input signal 6. Model 40 has a second error input at 224 and 240 selectively driving the output of model 40 away from such matching value and instead driving the correction signal 46 towards zero.

FIG. 20 uses like reference numerals from above and from FIGS. 19 and 20 of the incorporated '676 patent. Summer 260 sums the output 230 of C copy 144 and the output of filter 302 which supplies the input to A copy 214, and supplies the output resultant sum at 262 to multiplier 264. Summer 266 sums the output 268 of A copy 214 and the error input at 44, and supplies the output resultant sum at 270 to multiplier 264. Multiplier 264 multiplies the inputs 262 and 270, and supplies the output resultant product as weight update signal 74 to A filter 12. Summer 272 sums the output 246 of C copy 146 and the output 304 of filter 302 which supplies the input to B copy 216, and supplies the output resultant sum at 274 to multiplier 276. Summer 278 sums the output 280 of B copy 216 and the error input at 44, and supplies the output resultant sum at 282 to multiplier 276. Multiplier 276 multiplies inputs 282 and 274, and supplies the output resultant product as weight update signal 78 to B filter 22.

The error signals at 44 and 268 oppositely drive the model. The error signal at error input 44 of the direct transfer function filter A drives the correction signal at 46 towards a value matching the system input signal 6. The error signal at error input 268 of filter A drives the correction signal at 46 away from the noted matching value by driving the correction signal towards zero. As noted above, this is accomplished by using a copy 214 of the A filter and supplying the output of such copy as an error input to the adaptive model such that in attempting to drive the error input to zero, the model must drive its output to zero. The signal at error input 268 is provided only in response to a given condition of a given parameter, e.g., when the frequency is in the ranges passed by filter 302. The relative amplitudes of the input signals at error inputs 44 and 268 to summer 266 are adjusted such that the signal at error input 268 dominates when both are present, or the degree of dominance is adjusted to in turn adjust the amount of constrainment of performance of the model so that the correction signal at 46 is driven towards zero but never reaches zero, such that there is still some modification and/or cancellation of the system input signal, though to a reduced degree. When the frequency is outside of the ranges passed by filter 302, there is no output at 212, and hence no input to A copy 214 and hence the latter's output is undefined, whereby error input 44 to summer 266 from error transducer 16 dominates and hence the model drives correction signal 46 to a value which matches the system input signal 6 to provide modification and/or control of the latter. The gain is controlled at control input 308 by the control signal provided from peak detector 312 and filter 306. The error inputs 44 and 280 at summer 278 to the recursive transfer function filter B of model 40 function comparably to error inputs 44 and 268 at summer 266, respectively. Model 40 in FIG. 6 has a first error input provided at 44 to summers 266 and 278 from error transducer 16 driving the output of the model towards a value matching the system input signal 6. Model 40 has a second error input at 268 and 280 selectively driving the output of model 40 away from such matching value and instead driving the correction signal 46 towards zero.

Figure 21:
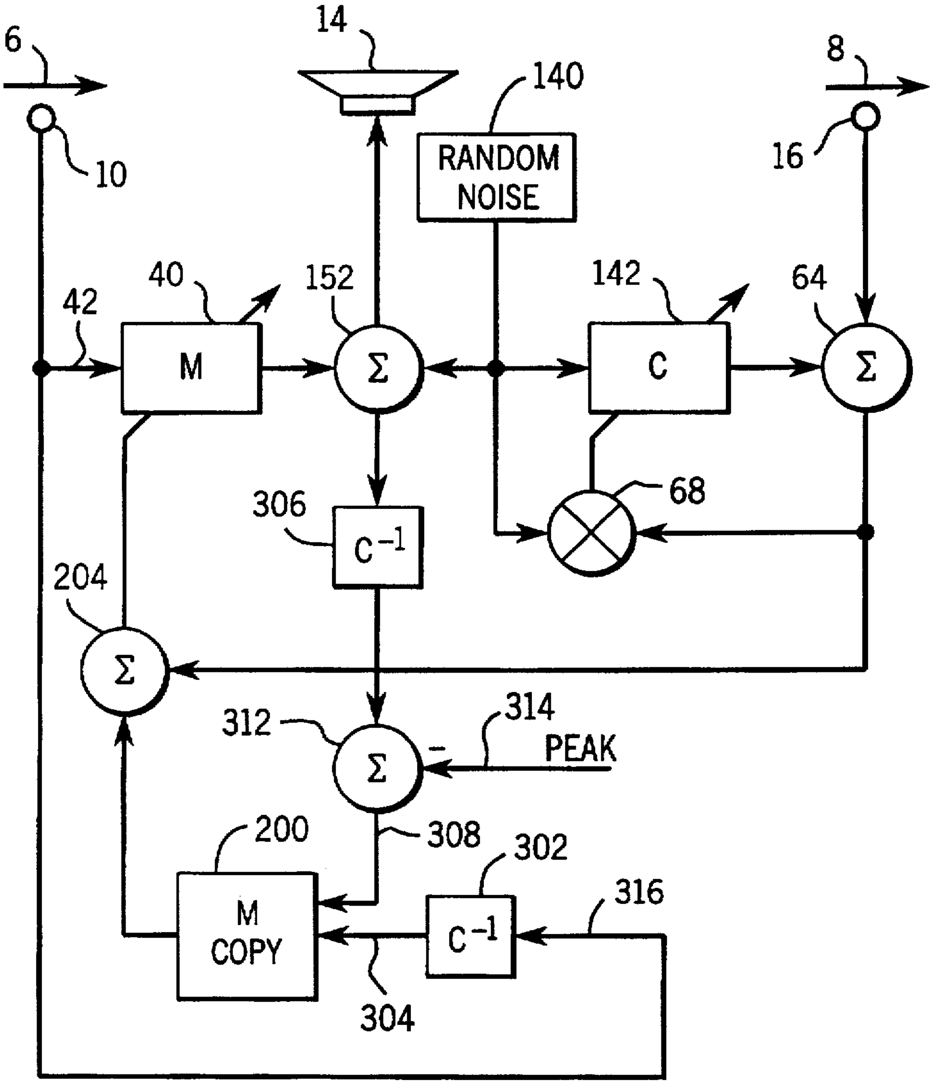
FIG. 21 shows a further embodiment of the system of FIG. 18.

FIG. 21 uses like reference numerals from FIG. 18 and illustrates a further embodiment. In FIG. 21, spectral transfer function filter 302 has its input 316 supplied from the reference signal from input transducer 10, rather than from the correction signal from the output of model 40, FIG. 18, or the random noise signal source 208, FIG. 15. The output of spectral transfer function filter 302 is supplied to filter input 304 of M copy 200, as above. The spectral transfer function provided by filter 306 includes a peak detector 312 similar to peak detector 97, FIG. 7. The output of inverse C model 306 is supplied to peak detector 312 comparing the output of inverse C model 306 with a desired peak value 314. When the output of inverse C model copy 306 rises above the level of peak value 314, the positive output of summer 312 at the control input 308 controls the gain of M copy 200 to in turn control the gain of the leak signal at filter input 304 supplied through the spectral transfer function 302 from the reference signal from input transducer 10.

Filters 95, 302, 306 are each preferably an inverse C model copy provided by inverse S and/or inverse E, though other transfer functions may be used for any or all of such filters.

In further embodiments, performance of model 40 is controlled according to fuzzy logic to control the signal sent to output transducer 14. Fuzzy logic control is known in the prior art, for example "Adaptive Fuzzy Systems", E. Cox, IEEE Spectrum February 1993, pages 27–31, and the references noted therein at page 31, lower half of right column. In the present invention, fuzzy logic is used to provide self-designing control architecture using fuzzy rules and/or to control the filter weights which update the model and/or to control the leak signal which degrades performance of the model. The fuzzy logic controller, having a given set of rules, is used for computing or setting the control architecture and/or the filter transfer function and/or the filter weights and/or the leak signal.

Figure 22:
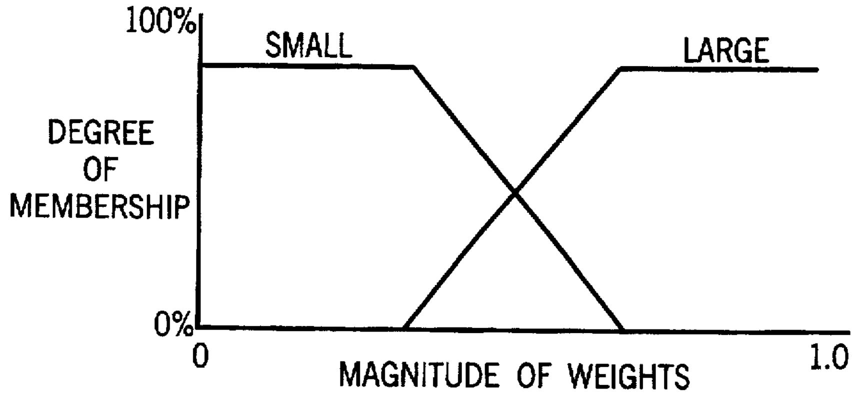
FIGS. 22–24 illustrate a further embodiment of the invention.
Figure 23:
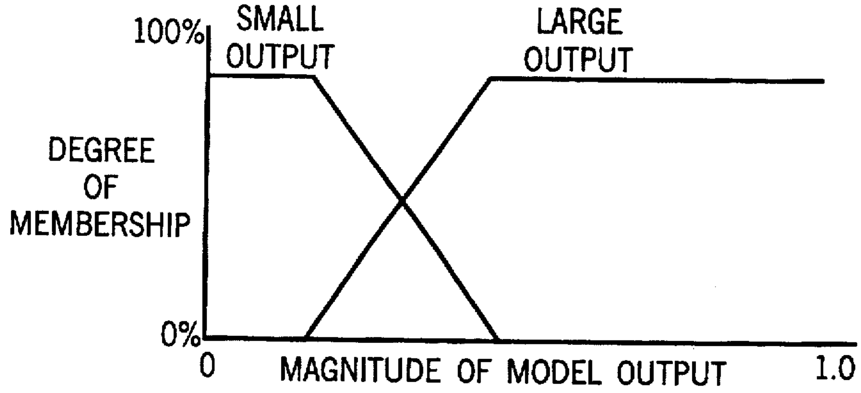
Figure 24:
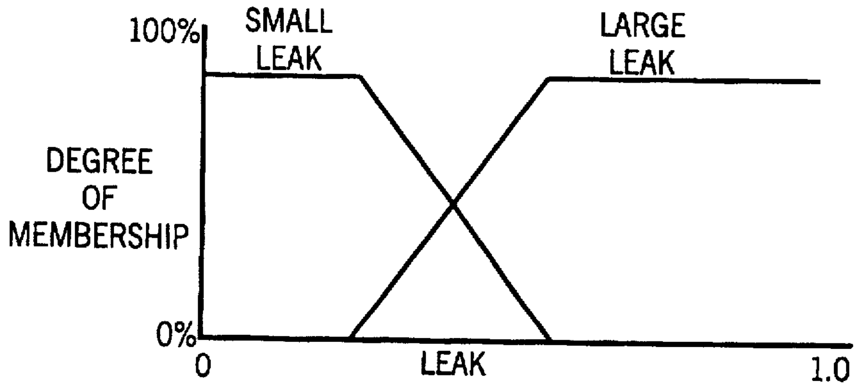

Fuzzy logic enables control of model performance in a practical way for a multiplicity of factors which interact in a complex way. The fuzzy logic control is based upon relative values and qualitative trends, without requiring exact equation relationships for multiple variables. For example, referring to FIGS. 22–24, which are similar to FIG. 4, page 29 of the above noted Cox article, if the magnitude of the weights is small, FIG. 22, and the magnitude of the correction signal output of model 40 is small, FIG. 23, then only a small leakage value is introduced, FIG. 24, to maximize the adaptive process. If the magnitude of the weights is large and the magnitude of the model output is large, then a large leak signal is introduced, to constrain model performance and minimize the adaptive process. In this example, the filter weights are monitored to provide a first input parameter, and the output of the model is monitored to provide a second input parameter. Fuzzy logic is applied to such first and second input parameters to provide an output parameter, FIG. 24, controlling the weights and/or leak and/or otherwise controlling performance of the model. The input parameters are fuzzified according to a fuzzy rule set, FIGS. 22 and 23, a fuzzy leak is computed and then defuzzified using FIG. 24, to provide an output parameter to control performance of the model.

In another example, if the correction signal magnitude is nearing the capacity of output transducer 14 such as a loudspeaker, then leakage is increased. If the magnitude of the correction signal is not nearing the capacity of the loudspeaker, then leakage can be decreased.

In another example, rate of change of the weights is monitored, and if the weights start increasing at a faster rate or at a rate above a given rate, then leakage is increased. If the weights are increasing rapidly and the magnitude of the correction signal is approaching the capacity of the loudspeaker, then leakage is increased very rapidly. If the weights start decreasing, then leakage is decreased.

Inputs to the fuzzy logic include magnitude of the filter update weight, magnitude of the model output correction signal, rate of change of the filter weights, rate of change of the correction signal output by the model, magnitude of the reference signal 42 input to the model, rate of change of input signal 42, magnitude of the error signal from error transducer 16, rate of change of the error signal, spectral characteristics of the reference signal and/or correction signal and/or error signal, capability of output transducer 14, temperature, flow rates, environmental variables, fan speed in a duct application, whether or not such fan is running, thermostat settings, desired speed of adaptation, desired algorithm stability, system plant information, source information, etc. Fuzzy logic is a means of introducing human-like intuition into the controller adjustment process. Some factors may override others. For example, if the rate of increase of the weights is too large, then the algorithm may become unstable, and hence it is desirable to increase the leak or decrease the model update gain. If the capacity of a loudspeaker 14 is rapidly being reached, then leakage should be increased.

In further embodiments, the invention is applicable to multi-channel active acoustic attenuation systems, for example as shown in U.S. Pat. Nos. 5,216,721 and 5,216,722, incorporated herein by reference.

It is recognized that various equivalents, alternatives and modifications are possible within the scope of the appended claims.

We claim:

1. An active adaptive control method comprising introducing a control signal from an output transducer to combine with a system input signal and yield a system output signal, sensing said system output signal with an error transducer providing an error signal, providing an adaptive filter model having a model input from a reference signal correlated to said system input signal, and an output outputting a correction signal to said output transducer to introduce said control signal, spectrally controlling performance of said model to maximize the signal sent to said output transducer at frequencies of interest, providing a spectral leak signal degrading performance of said model, and controlling said leak signal according to frequency.

2. The method according to claim 1 comprising monitoring said correction signal and controlling said leak signal in response thereto.

3. The method according to claim 2 comprising filtering said correction signal to provide said leak signal.

4. The method according to claim 3 comprising spectrally processing said correction signal by supplying said correction signal through a frequency responsive spectral transfer function.

5. The method according to claim 4 comprising modeling the transfer function between said output transducer and said error transducer with a second model, and wherein said spectral transfer function is a function of said second model.

6. The method according to claim 4 comprising supplying said correction signal from said model output through said frequency responsive spectral transfer function to an error input of said model.

7. The method according to claim 2 wherein said model output outputs said correction signal to said output transducer to introduce said control signal according to a weight update signal, and comprising combining said reference signal and said error signal to provide said weight update signal, and controlling said leak signal by controlling said weight update signal in response to said correction signal.

8. The method according to claim 1 comprising providing a copy of said model, said copy having an output supplied to said error input of said model, said copy having a filter input receiving a spectrally proccessed input signal from a spectral transfer function, said copy having a control input controlling convergence gain of said copy and receiving a spectral control signal.

9. The method according to claim 8 wherein said spectral control signal is responsive to said correction signal.

10. The method according to claim 9 comprising providing a second spectral transfer function, and supplying said correction signal through said second spectral transfer function to said control input of said copy to provide said spectral control signal.

11. The method according to claim 10 wherein said first and second spectral transfer functions are the same.

12. The method according to claim 10 comprising modeling the transfer function between said output transducer and said error transducer with a second model, and wherein each of said first and second spectral transfer functions is a function of said second transfer function.

13. The method according to claim 10 wherein said first and second spectral transfer functions are different.

14. The method according to claim 1 comprising spectrally processing said leak signal such that at frequencies where maximum power from said output transducer reaches said error transducer, the correction signal supplied to said output transducer is maximized, and at frequencies where minimum power from said output transducer reaches said error transducer, the correction signal supplied to said output transducer is minimized.

15. The method according to claim 14 comprising modeling the transfer function between said output transducer and said error transducer with a second model, and spectrally processing said leak signal as a function of said second model.

16. The method according to claim 15 wherein said function of said second model is the inverse of said second model.

17. The method according to claim 16 wherein said first model is controlled by an update signal from said inverse of said second model such that at frequencies where maximum power from said output transducer reaches said error transducer, said second model has a maximum transfer characteristic and said inverse of said second model has a minimum transfer characteristic minimizing leakage of said update signal, to enable maximum output of said first model, and at frequencies where minimum power from said output transducer reaches said error transducer, said second model has a minimum transfer characteristic and said inverse of said second model has a maximum transfer characteristic maximizing leakage of said update signal, to minimize the output of said first model.

18. The method according to claim 1 comprising filtering said reference signal to provide said leak signal.

19. The method according to claim 18 comprising spectrally processing said reference signal by supplying said reference signal through a frequency responsive spectral transfer function.

20. The method according to claim 19 comprising modeling the transfer function between said output transducer and said error transducer with a second model, and wherein said spectral transfer function is a function of said second model.

21. The method according to claim 18 comprising monitoring said correction signal and controlling said leak signal in response thereto.

22. The method according to claim 1 comprising spectrally processing said leak signal by supplying said leak signal through a frequency responsive spectral transfer function.

23. The method according to claim 22 wherein said leak signal is provided by said correction signal, and comprising supplying said correction signal through said frequency responsive spectral transfer function.

24. The method according to claim 23 comprising supplying said correction signal from said model output through said frequency responsive spectral transfer function to said error input of said model.

25. The method according to claim 24 comprising providing a copy of said model, and supplying said correction signal from said model output through said frequency responsive spectral transfer function and through said copy to said error input of said model.

26. The method according to claim 22 comprising providing a copy of said model, and supplying said leak signal through said frequency responsive spectral transfer function and through said copy to said error input of said model.

27. The method according to claim 26 wherein said copy has a filter input receiving the output of said frequency responsive spectral transfer function, said copy has a control input controlling convergence gain of said copy, and comprising providing a second frequency responsive spectral transfer function, and supplying said correction signal from said output of said model through said second frequency responsive spectral transfer function to said control input of said copy.

28. The method according to claim 26 comprising supplying a random noise signal to the input of said spectral transfer function.

29. The method according to claim 26 comprising supplying said correction signal from said output of said model to the input of said spectral transfer function.

30. The method according to claim 1 comprising spectrally controlling performance of said model in response to said correction signal.

31. The method according to claim 30 wherein said model outputs said correction signal to said output transducer to introduce said control signal according to a weight update signal, and comprising combining said reference signal and said error signal to provide said weight update signal, monitoring and spectrally sensing said correction signal and providing selective leakage of said weight update signal in response thereto to control performance of said model according to frequency, to optimize performance of said model in frequency ranges of interest.

32. The method according to claim 30 comprising providing a copy of said model and supplying the output of said copy to said error input of said model and monitoring and spectrally sensing said correction signal and providing an input to said copy in response thereto to control performance of said model according to frequency, to optimize performance of said model in frequency ranges of interest.

33. The method according to claim 1 comprising frequency weighting said leak signal to optimize performance of said model in frequency ranges of interest.

34. The method according to claim 33 comprising frequency weighting said leak signal by spectrally processing said correction signal through a frequency responsive spectral transfer function.

35. The method according to claim 33 comprising frequency weighting said leak signal by spectrally processing said correction signal through a frequency responsive spectral transfer function and through a copy of said model.

36. The method according to claim 33 comprising frequency weighting said leak signal by spectrally processing a random noise signal through a frequency responsive spectral transfer function and through a copy of said model.

37. The method according to claim 33 comprising frequency weighting said leak signal by spectrally processing a random noise signal through a first frequency responsive spectral transfer function and through a copy of said model, and spectrally processing said correction signal through a second frequency responsive spectral transfer function and through said copy of said model.

38. The method according to claim 33 comprising frequency weighting said leak signal by spectrally processing said correction signal through a first frequency responsive spectral transfer function and through a copy of said model, and spectrally processing said correction signal through a second frequency responsive spectral transfer function and through said copy of said model.

39. The method according to claim 1 comprising spectrally controlling performance of said model in response to said reference signal.

40. The method according to claim 39 wherein said model outputs said correction signal to said output transducer to introduce said control signal according to a weight update signal, and comprising combining said reference signal and said error signal to provide said weight update signal, monitoring and spectrally sensing said reference signal and providing selective leakage of said weight update signal in response thereto to control performance of said model according to frequency, to optimize performance of said model in frequency ranges of interest.

41. An active adaptive control system comprising an output transducer introducing a control signal to combine with a system input signal and yield a system output signal, an error transducer sensing said system output signal and providing an error signal, an adaptive filter model having a model input from a reference signal correlated to said system input signal, and an output outputting a correction signal to said output transducer to introduce said control signal, a spectral controller spectrally controlling performance of said model to maximize the signal sent to said output transducer at frequencies of interest, said spectral controller providing a spectral leak signal degrading performance of said model and controlling said leak signal according to frequency.

42. An active adaptive control method comprising introducing a control signal from an output transducer to combine with a system input signal and yield a system output signal, sensing said system output signal with an error transducer providing an error signal, providing an adaptive filter model having a model input from a reference signal correlated to said system input signal, and a model output outputting a correction signal to said output transducer to introduce said control signal according to a weight update signal, adaptively varying said weight update signal by providing a spectral leak signal degrading performance of said model and controlling said leak signal according to frequency.

* * * * *